(12) United States Patent
Takahata et al.

(10) Patent No.: US 11,791,345 B2
(45) Date of Patent: Oct. 17, 2023

(54) ACTIVE MATRIX SUBSTRATE AND METHOD FOR MANUFACTURING SAME

(71) Applicant: Sharp Kabushiki Kaisha, Sakai (JP)

(72) Inventors: Hitoshi Takahata, Sakai (JP); Tetsuo Kikuchi, Sakai (JP); Kengo Hara, Sakai (JP); Setsuji Nishimiya, Sakai (JP); Masahiko Suzuki, Sakai (JP); Tohru Daitoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 140 days.

(21) Appl. No.: 17/559,045

(22) Filed: Dec. 22, 2021

(65) Prior Publication Data

US 2022/0208793 A1 Jun. 30, 2022

(30) Foreign Application Priority Data

Dec. 24, 2020 (JP) ................... 2020-214854

(51) Int. Cl.
| | | |
|---|---|---|
| G02F 1/1368 | (2006.01) | |
| G02F 1/1362 | (2006.01) | |
| G02F 1/1333 | (2006.01) | |
| G02F 1/1343 | (2006.01) | |
| H01L 27/12 | (2006.01) | |

(Continued)

(52) U.S. Cl.
CPC .... *H01L 27/1225* (2013.01); *G02F 1/133345* (2013.01); *H01L 21/02565* (2013.01);

(Continued)

(58) Field of Classification Search
CPC .. G02F 1/1343; G02F 1/13439; G02F 1/1362; G02F 1/136286; G02F 1/1368;

(Continued)

(56) References Cited

U.S. PATENT DOCUMENTS

2008/0035920 A1 2/2008 Takechi et al.
2008/0225024 A1 9/2008 Ito (Continued)

FOREIGN PATENT DOCUMENTS

JP 2006-119404 A 5/2006
JP 2008-040343 A 2/2008

(Continued)

*Primary Examiner* — Thoi V Duong

(74) *Attorney, Agent, or Firm* — KEATING & BENNETT, LLP

(57) ABSTRACT

An active matrix substrate includes a first TFT having an oxide semiconductor layer formed from a first oxide semiconductor film and a second TFT having an oxide semiconductor layer formed from a second oxide semiconductor film. The oxide semiconductor layer of each TFT includes a high-resistance region including a channel region and offset regions and low-resistance regions including a source contact region, a drain contact region, and interposed regions. The first TFT has a gate insulating layer including a first insulating film and a second insulating film. The second TFT has a gate insulating layer including the second insulating film but not including the first insulating film. A total length L1 of the offset regions of the first TFT in a channel length direction is greater than a total length L2 of the offset regions of the second TFT in the channel length direction.

20 Claims, 16 Drawing Sheets

(51) Int. Cl.
*H01L 29/786* (2006.01)
*H01L 21/02* (2006.01)
*H01L 29/66* (2006.01)

(52) U.S. Cl.
CPC .......... *H01L 27/124* (2013.01); *H01L 27/127* (2013.01); *H01L 27/1288* (2013.01); *H01L 29/66969* (2013.01); *H01L 29/7869* (2013.01); *H01L 29/78633* (2013.01); *H01L 29/78696* (2013.01); *G02F 1/1368* (2013.01); *G02F 1/13439* (2013.01); *G02F 1/13685* (2021.01); *G02F 1/136286* (2013.01)

(58) Field of Classification Search
CPC .......... G02F 1/13685; H01L 21/02565; H01L 27/1225; H01L 27/124; H01L 27/1288; H01L 27/1237; H01L 27/1259; H01L 29/66969; H01L 29/78633; H01L 29/7869; H01L 29/78696
See application file for complete search history.

(56) References Cited

U.S. PATENT DOCUMENTS

| | | |
|---|---|---|
| 2012/0138922 A1 | 6/2012 | Yamazaki et al. |
| 2013/0038518 A1 | 2/2013 | Tagawa et al. |
| 2013/0320334 A1 | 12/2013 | Yamazaki et al. |
| 2014/0138678 A1* | 5/2014 | Ito .................. H01L 29/7869 257/43 |
| 2014/0286076 A1 | 9/2014 | Aoki et al. |

FOREIGN PATENT DOCUMENTS

| | | |
|---|---|---|
| JP | 2008-225036 A | 9/2008 |
| JP | 2012-134475 A | 7/2012 |
| JP | 2014-007399 A | 1/2014 |
| JP | 2014-209727 A | 11/2014 |
| JP | 2015-109315 A | 6/2015 |
| WO | 2011/118079 A1 | 9/2011 |

* cited by examiner

ACTIVE MATRIX SUBSTRATE AND METHOD FOR MANUFACTURING SAME

BACKGROUND

1. Field

The present disclosure relates to an active matrix substrate and a method for manufacturing same.

2. Description of the Related Art

An active matrix substrate that is used in a liquid crystal display device, an organic electroluminescence (EL) display device, or other devices has a display area having a plurality of pixels and an area (i.e. a non-display area or a frame area) other than the display area. The display area is provided with switching elements such as thin-film transistors (hereinafter referred to as "TFTs") belonging separately to each of the pixels. As such switching elements, TFTs whose active layers are amorphous silicon films (hereinafter referred to as "amorphous silicon TFTs") or TFTs whose active layers are polycrystalline silicon films (hereinafter referred to as "polycrystalline silicon TFTs") have conventionally been widely used.

Using an oxide semiconductor instead of amorphous silicon or polycrystalline silicon as a material for the active layer of a TFT has been proposed. Such a TFT is referred to as "oxide semiconductor TFT". An oxide semiconductor has higher mobility than amorphous silicon. For this reason, an oxide semiconductor TFT can operate at a higher speed than an amorphous silicon TFT.

Structures of TFTs are broadly divided into a bottom-gate structure and a top-gate structure. Although most oxide semiconductor TFTs employ the bottom-gate structure, using the top-gate structure too has been proposed (see, for example, Japanese Unexamined Patent Application Publication No. 2015-109315). The top-gate structure, in which a thin gate insulating layer can be used, gives high current supply performance.

A peripheral circuit such as a drive circuit may be monolithically (integrally) formed in the non-display area of an active matrix substrate. Monolithic formation of a drive circuit makes it possible to narrow the non-display area and to reduce costs through simplification of a mounting step. For example, in the non-display area, a gate driver circuit may be monolithically formed, and a source driver circuit may be mounted by a COG (Chip on Glass) method.

In a device strongly expected to have a narrower frame, such as a smartphone, a demultiplexer circuit such as a source shared driving (SSD) circuit may be monolithically formed in addition to a gate driver. An SSD circuit is a circuit that distributes video data to a plurality of source lines from one video signal line separately from each of terminals of a source driver. Mounting an SSD circuit makes it possible to further narrow an area (terminal area, wire formation region) in the non-display area in which terminals and wires are disposed. Further, with a reduction in the number of outputs from a source driver and a reduction in circuit size, the cost of a driver IC can be reduced.

A peripheral circuit such as a drive circuit or an SSD circuit includes TFTs. TFTs disposed as switching elements belonging separately to each of the pixels of the display area are herein referred to as "pixel TFTs" or "pixel transistors", and TFTs constituting the peripheral circuit are herein referred to as "circuit TFTs" of "circuit transistors". Further, those of the circuit TFTs which constitute the drive circuit are referred to as "drive circuit TFTs", and those of the circuit TFTs which constitute the SSD circuit are referred to as "SSD circuit TFTs".

In an active matrix substrate using oxide semiconductor TFTs as pixel TFTs, it is preferable, from a manufacturing process perspective, that circuit TFTs be made of the same oxide semiconductor film as the pixel TFTs through a common process. For this reason, the circuit TFTs and the pixel TFTs usually have the same structure. The characteristics of these TFTs too are substantially the same.

However, a pixel TFT and a circuit TFT are expected to have different characteristics. Further, even among circuit TFTs, for example, a driving circuit TFT and an SSD circuit TFT are expected to have different characteristics. In recent years, there has been an increase in the number of types of peripheral circuit that are monolithically formed in an active matrix substrate, and along with this, a circuit TFT has been expected to have further diversified performance.

Thus, in the field of active matrix substrates each including a plurality of TFTs of different uses, a plurality of oxide semiconductor TFTs having different characteristics need to be fabricated depending on the purposes so that the TFTs can have characteristics that they are expected to have depending on their intended uses.

It is desirable to provide an active matrix substrate including a plurality of oxide semiconductor TFTs having a top-gate structure and differing in characteristic from each other.

SUMMARY

According to an aspect of the disclosure, there is provided an active matrix substrate including a substrate and a plurality of oxide semiconductor TFTs, supported by a principal surface of the substrate, that include a first TFT and a second TFT. Each of the oxide semiconductor TFTs has an oxide semiconductor layer, a gate insulating layer disposed over a part of the oxide semiconductor layer, a gate electrode disposed over a part of the gate insulating layer, a source electrode, and a drain electrode. The oxide semiconductor layer of the first TFT is formed from a first oxide semiconductor film. The oxide semiconductor layer of the second TFT is a layer that is separate from the oxide semiconductor layer of the first TFT, and is formed from a second oxide semiconductor film that is higher in mobility than the first oxide semiconductor film. Each of the oxide semiconductor layers of the first and second TFTs includes a high-resistance region covered with the gate insulating layer, and low-resistance regions located on both sides of the high-resistance region and not covered with the gate insulating layer, and the low-resistance regions have smaller specific resistance than the high-resistance region. The high-resistance region includes a channel region overlapping the gate electrode when viewed from an angle parallel with a direction normal to the principal surface of the substrate and offset regions that, when viewed from an angle parallel with the direction normal to the principal surface of the substrate, overlap the gate insulating layer but do not overlap the gate electrode, and the offset regions include source-side and drain-side offset regions located on both sides, respectively, of the channel region. The low-resistance regions include a source contact region electrically connected to the source electrode, a drain contact region placed opposite the source contact region across the high-resistance region and electrically connected to the drain electrode, a source-side interposed region located between the source contact region and the high-resistance region, and a drain-side interposed region located between the drain contact region and the high-resistance region. The gate insulating layer of the first TFT includes a first insulating film and a second insulating film disposed over the first insulating film. The gate insulating layer of the second TFT includes the second insulating film but does not include the first insulating film. A total length L1 of the offset regions of the first TFT in a channel length direction is greater than a total length L2 of the offset regions of the second TFT in the channel length direction.

According to another aspect of the disclosure, there is provided a method for manufacturing the active matrix substrate according to the aforementioned aspect. The method includes (A) forming the oxide semiconductor layer of the first TFT over the substrate, (B) forming an insulating film as so that the insulating film covers the oxide semiconductor layer of the first TFT, the insulating film being to serve as the first insulating film, (C) forming the oxide semiconductor layer of the second TFT over the insulating film, (D) forming a different insulating film so that the different insulating film covers the oxide semiconductor layer of the second TFT, the different insulating film being to serve as the second insulating film, (E) forming the gate electrode of the first TFT and the gate electrode of the second TFT over the different insulating film, (F) by patterning the insulating film and the different insulating film after step (E), obtaining the first insulating film and the second insulating film from the insulating film and the different insulating film, respectively, thereby forming the gate insulating layer of the first TFT and the gate insulating layer of the second TFT and forming the first insulating layer on a side of the oxide semiconductor layer of the second TFT that faces the substrate, and (G) by subjecting each of the first and second TFTs to a resistance lowering process for making portions of the oxide semiconductor layer not covered with the gate insulating layer lower in specific resistance than a portion of the oxide semiconductor layer covered with the gate insulating layer, forming the low-resistance regions in the portions of the oxide semiconductor layer not covered with the gate insulating layer.

DESCRIPTION OF THE EMBODIMENTS

Figure 1:
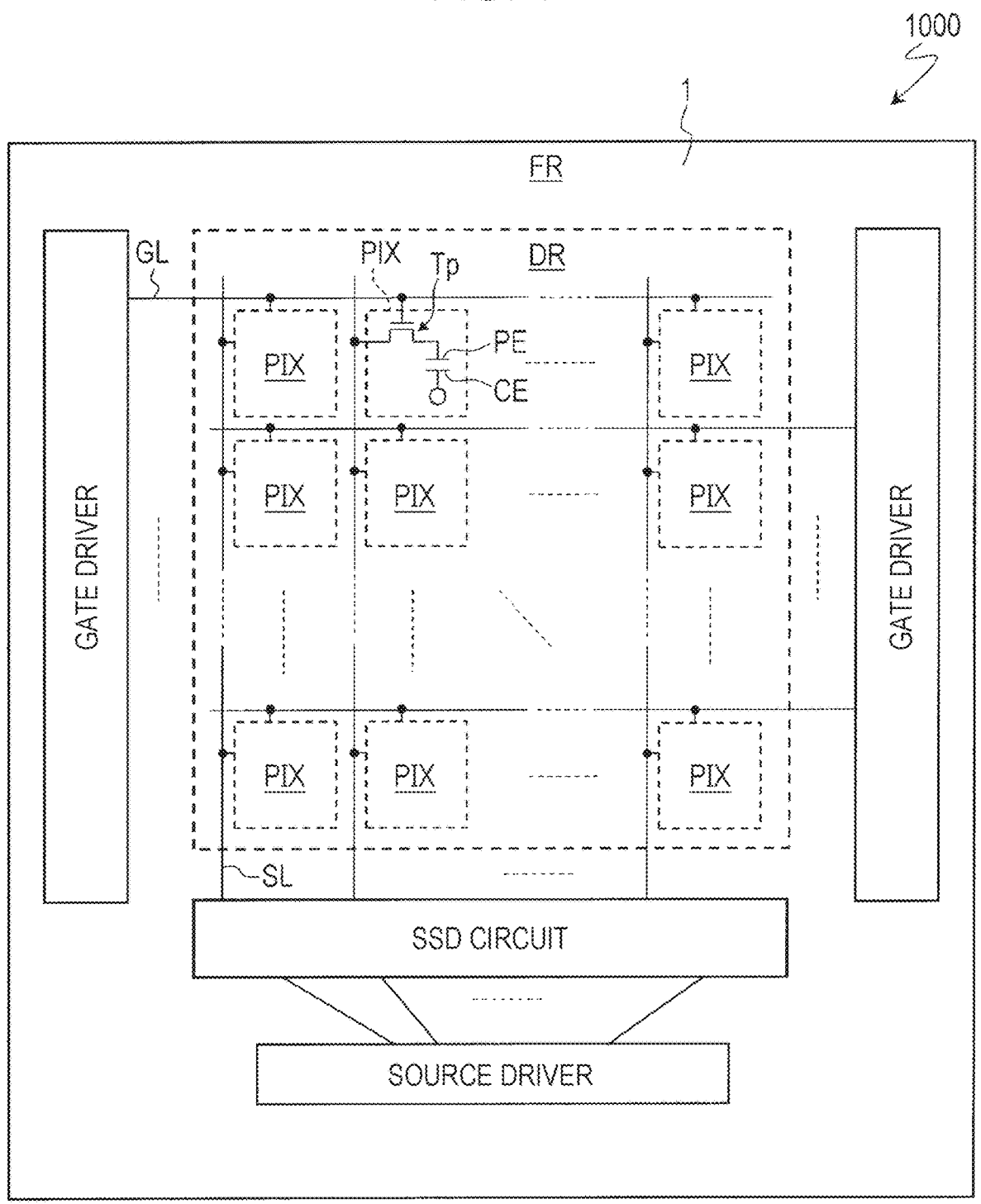
FIG. 1 is a schematic view showing an example of a planar structure of an active matrix substrate according to a first embodiment.

As mentioned above, TFTs provided in an active matrix substrate are expected to have different characteristics depending on their intended uses. In the following, examples of suitable TFT characteristics are described by taking as an example an active matrix substrate that is used in a liquid crystal display device.

An SSD circuit TFT, which is used in an SSD circuit, is expected to have high current drive force, as it needs to pass a comparatively large on-current. Using a TFT with small current drive force may make it difficult to charge a source bus line in a predetermined period of time. Further, increasing the channel width of a TFT to ensure the desired current drive force may increase the size of the TFT and make it difficult to achieve a narrower frame. For this reason, it is preferable that the SSD circuit TFT be lower in threshold voltage and even higher in on-current. The SSD circuit TFT may for example have a depression characteristic having a negative threshold voltage.

On the other hand, it is preferable that a drive circuit TFT, which is used in a drive circuit such as a gate driver, have its threshold voltage shifted further in a positive direction than the threshold voltage of an SSD circuit TFT for a reduction in off-leak current. A large off-leak current may become a factor for a malfunction such as an increase in power consumption or a failure in operation of the drive circuit. The drive circuit TFT may for example have an enhancement characteristic having a positive threshold voltage.

Further, it is preferable that as a pixel TFT, which is used in the liquid crystal display device, a TFT with a small off-leak current be used. This makes it possible to reduce deterioration in contrast of display. The pixel TFT may have a depression characteristic or an enhancement characteristic.

Uses and expected characteristics of TFTs are not limited to the aforementioned examples but have diversified.

The inventors studied to find it difficult to form a plurality of TFTs of different characteristics by utilizing the same oxide semiconductor film. For example, although it is preferable that an SSD circuit TFT be made of an oxide semiconductor having high mobility, the high mobility of the oxide semiconductor causes the threshold voltage of the TFT to shift in a negative direction to have a depression characteristic. A TFT having a depression characteristic may be unsuited for a drive circuit TFT. On the other hand, although it is preferable that a drive circuit TFT have an enhancement characteristic, a TFT having an enhancement characteristic may be unfitted for another peripheral circuit such as an SSD circuit, as it is difficult to further increase the on-current of such a TFT.

To address this problem, it is conceivable that a plurality of TFTs of different characteristics may be formed by using different oxide semiconductor films as their active layers. However, simply varying materials for oxide semiconductor films is not enough to make it easy to achieve the characteristics that the plurality of TFTs are expected to have depending on their intended uses.

On the basis of the findings, the inventors found a method for fabricating, depending on the purposes, a plurality of top-gate TFTs that may have characteristics that they are expected to have depending on their intended uses. According to one embodiment of the present disclosure, varying structures of gate insulating layers and active layers in addition to materials for active layers makes it possible to control the characteristics of the TFTs independently of each other. This also makes it possible to fabricate these TFTs depending on the purposes while holding down an increase in the number of manufacturing steps and an increase in manufacturing cost.

First Embodiment

In the following, an active matrix substrate according to a first embodiment is described with reference to the drawings by taking as an example an active matrix substrate that is used in a liquid crystal display device. Basic Configuration of Active Matrix Substrate 1000

FIG. 1 is a schematic view showing an example of a planar structure of an active matrix substrate 1000 according to the present embodiment.

The active matrix substrate 1000 has a display area DR and an area (i.e. a non-display area or a frame area) FR other than the display area DR. The display area DR is constituted by pixel areas PIX arrayed in a matrix. A pixel area PIX (sometimes simply referred to as "pixel") is an area that corresponds to a pixel of a display device. The non-display area FR is an area, located around the display area DR, that does not contribute to a display.

The non-display area FR is integrally (monolithically) provided, for example, with gate drivers, a demultiplexer circuit functioning as an SSD circuit, or other circuits. A source driver is mounted, for example, on the active matrix substrate 1000.

The display area DR has formed therein a plurality of gate bus lines GL extending in a row-wise direction and a plurality of source bus lines SL extending in a column-wise direction. Each of the pixel areas PIX is defined, for example, by gate bus lines GL and source bus lines SL. The gate bus lines GL are connected separately to each of terminals of each of the gate drivers. The source bus lines SL are connected separately to each of terminals of the source driver.

Each of the pixel areas PIX has a pixel transistor (pixel TFT) Tp and a pixel electrode PE. The pixel transistor Tp has a gate electrode electrically connected to a corresponding one of the gate bus lines GL, a source electrode electrically connected to a corresponding one of the source bus lines SL, and a drain electrode electrically connected to the pixel electrode PE. In a case where the active matrix substrate 1000 is applied to a display device of a transverse electric field mode such as an FFS (fringe field switching) mode, the active matrix substrate 1000 is provided with an electrode (common electrode) that is common to the plurality of pixels. In a case where the active matrix substrate 1000 is applied to a display device of a longitudinal electric field mode, a common electrode CE may be provided on a counter substrate that is placed opposite the active matrix substrate 1000 across a liquid crystal layer.

The non-display area FR of the active matrix substrate 1000 has formed therein a plurality of circuit TFTs constituting a peripheral circuit. The circuit TFTs include drive circuit TFTs constituting the gate drivers, SSD circuit TFTs constituting the SSD circuit, or other circuits.

TFT Structures in Active Matrix Substrate 1000

Next, structures of a plurality of top-gate TFTs included in the active matrix substrate 1000 are described.

The active matrix substrate 1000 of the present embodiment includes a plurality of oxide semiconductor TFTs having a top-gate structure. Each of the oxide semiconductor TFTs has an oxide semiconductor layer and a gate electrode disposed over a part of the oxide semiconductor layer with a gate insulating layer sandwiched therebetween.

The plurality of oxide semiconductor TFTs include at least one first TFT and at least one second TFT. The first TFT and the second TFT have different characteristics from each other. An oxide semiconductor layer serving as the active layer of the first TFT is referred to as "first oxide semiconductor layer", and an oxide semiconductor layer serving as the active layer of the second TFT is referred to as "second oxide semiconductor layer". The first TFT and the second TFT differ from each other in the following respects.

(i) Oxide Semiconductor Material

The first oxide semiconductor layer and the second oxide semiconductor layer are separate layers (that is, formed from different oxide semiconductor films). In the present embodiment, the first oxide semiconductor layer is formed from a first oxide semiconductor film (hereinafter referred to as "low-mobility oxide semiconductor film") having relatively low mobility, and the second oxide semiconductor layer is formed from a second oxide semiconductor film (hereinafter referred to as "high-mobility oxide semiconductor film") having higher mobility than the low-mobility oxide semiconductor film.

(ii) Structure of Gate Insulating Layer

The gate insulating layer of the first TFT is thicker than the gate insulating layer of the second TFT. Specifically, the gate insulating layer of the first TFT includes a first insulating film and a second insulating film disposed over the first insulating film. On the other hand, in the second TFT, the second oxide semiconductor layer is located between the first insulating film and the second insulating film. For this reason, the gate insulating layer of the second TFT includes the second insulating film but does not include the first insulating film. With this, the capacitance (gate capacitance) of the gate insulating layer per unit area of the second TFT can be made higher than that of the first TFT. Accordingly, the on-current (drain current Id) of the second TFT can be made larger than that of the first TFT, with the same voltage Vdg being applied between the gate and the drain.

(iii) Length of Offset Region

The first oxide semiconductor layer and the second oxide semiconductor layer each include a high-resistance region in which a channel is formed and low-resistance regions, located on both sides of the high-resistance region, that are lower in specific resistance than the high-resistance region. The high-resistance region includes a channel region overlapping the gate electrode with the gate insulating layer sandwiched therebetween and an offset region that does not overlap the gate electrode when viewed from an angle parallel with a direction normal to a substrate 1. Providing the active layer of a TFT with an offset region makes it possible to reduce an off-leak current. However, the offset region is a region that does not face the gate electrode and, does not have its resistance lowered by the application of a voltage to the gate electrode when the TFT is turned on. For this reason, an increase in length (offset length) of the offset region in a channel length direction becomes a factor for a decrease in on-current.

In the present embodiment, the length L1 of offset regions (hereinafter referred to as "first offset regions") of the first oxide semiconductor layer in the channel length direction is greater than the length L2 of offset regions (hereinafter referred to as "second offset regions") of the second oxide semiconductor layer in the channel length direction. Accordingly, the first TFT may have an off-leak characteristic which is superior to that of the second TFT. The second TFT, in which deterioration in on-current due to the offset region can be reduced, may have a higher on-characteristic than the first TFT.

The oxide semiconductor layer of each of the TFTs may typically have offset regions on both sides (i.e. a source side and a drain side), respectively, of the channel region. In this case, the "length L1 of the first offset regions" refers to a total length of the source-side and drain-side offset regions of the first oxide semiconductor layer in the channel length direction. Similarly, the "length L2 of the second offset regions" refers to a total length of the source-side and drain-side offset regions of the second oxide semiconductor layer in the channel length direction.

As described in (i) to (iii) above, the first TFT and the second TFT have their gate insulating layers made different in structure from each other by having their active layers as separate layers and forming the second oxide semiconductor layer as the active layer of the second TFT between the first and second insulating films of the gate insulating layer of the first TFT. Furthermore, the lengths L1 and L2 of the offset regions of the first and second TFTs are made different from each other, for example, by utilizing the difference in thickness between the gate insulating layers. According to the present embodiment, the materials for the oxide semiconductor films of the TFTs, the thicknesses of the gate insulating layers, and the lengths of the offset regions can be controlled independently of one another, so that the characteristics of the TFTs can be controlled depending on their intended uses. Specifically, in the present embodiment, the second TFT may have higher mobility (TFT mobility) than the first TFT. As will be mentioned later, the first TFT may have a threshold voltage obtained by shifting the threshold voltage of the second TFT in a positive direction. The mobility of an actual TFT is herein referred to as "TFT mobility" for differentiation from the mobility of an oxide semiconductor material per se.

In the following, the structures of the first TFT and the second TFT in the present embodiment are more specifically described with reference to the drawings.

Figure 2A:
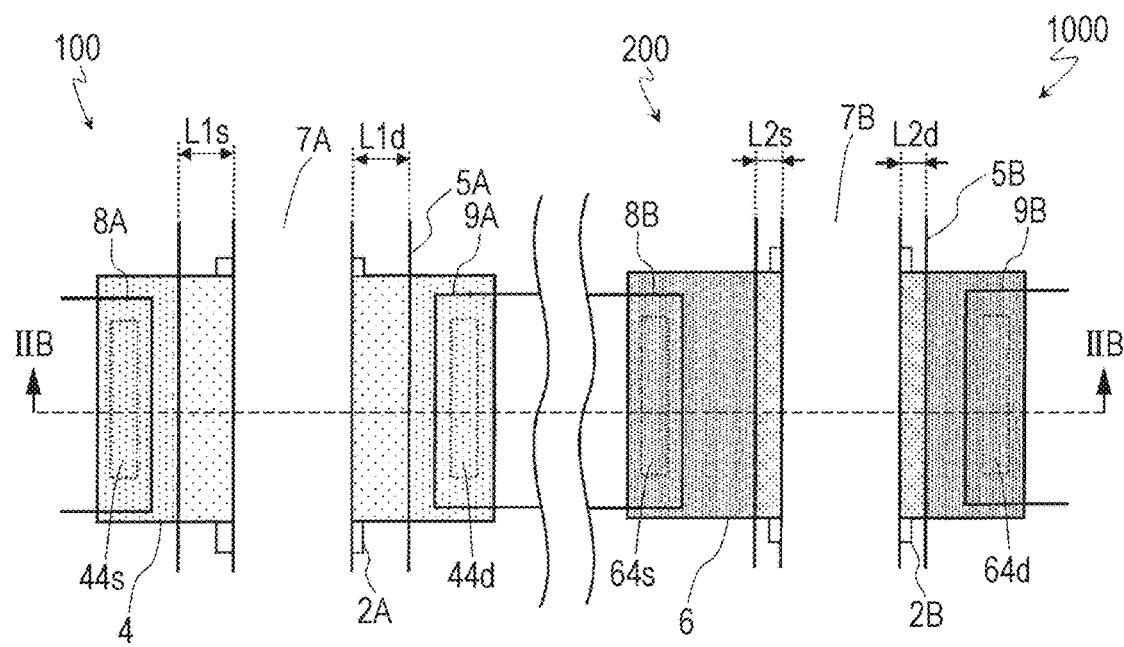
FIG. 2A is a plan view illustrating first and second TFTs formed in the active matrix substrate.
Figure 2B:
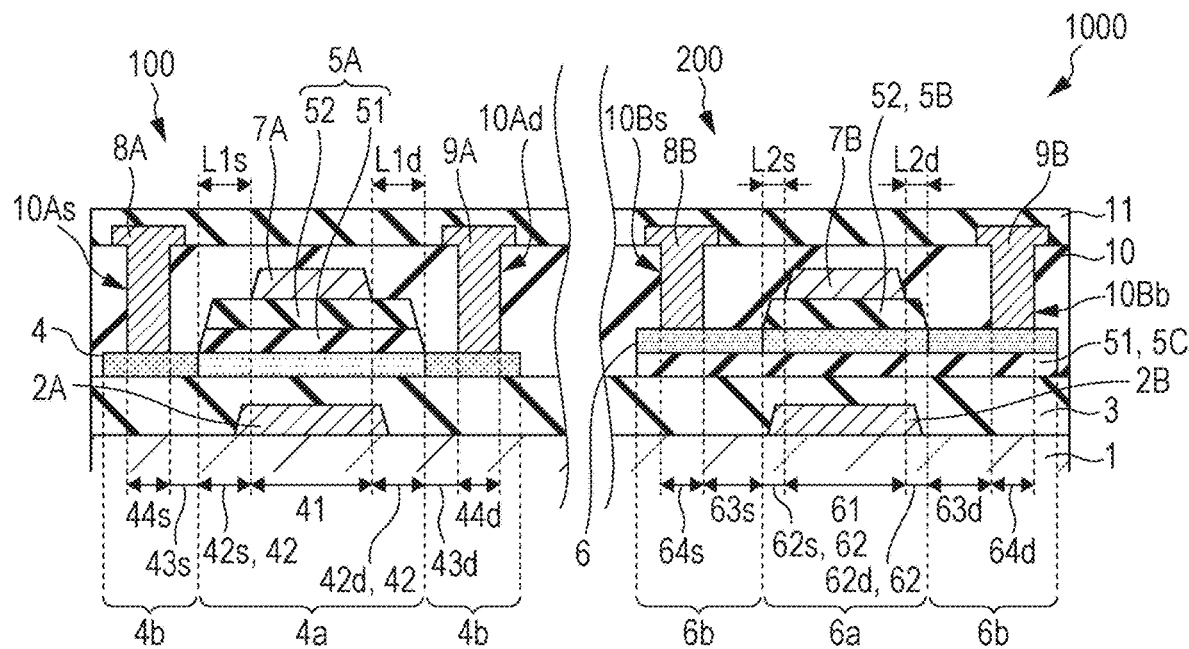
FIG. 2B is a cross-sectional view of the first TFT and the second TFT as taken along line IIB-IIB in FIG. 2A.

FIG. 2A is a plan view illustrating a first TFT 100 and a second TFT 200 in the active matrix substrate 1000, and FIG. 2B is a cross-sectional view taken along line IIB-IIB in FIG. 2A. Although the active matrix substrate 1000 may have a plurality of the first TFTs 100 and a plurality of the second TFTs 200, only a single first TFT 100 and a single second TFT 200 are illustrated for descriptive purposes.

The first TFT 100 and the second TFT 200 are top-gate TFTs, supported by the substrate 1, that have oxide semiconductor layers as their active layers.

The first TFT 100 has a first oxide semiconductor layer 4 as its active layer, and the second TFT 200 has a second oxide semiconductor layer 6 as its active layer. The first oxide semiconductor layer 4 and the second oxide semiconductor layer 6 are separate layers. The first oxide semiconductor layer 4 is formed from a low-mobility oxide semiconductor film having relatively low mobility. The second oxide semiconductor layer 6 is formed from a high-mobility oxide semiconductor film having higher mobility than the low-mobility oxide semiconductor film.

The first TFT 100 includes the first oxide semiconductor layer 4, which is disposed on a principal surface of the substrate 1, a gate insulating layer 5A disposed over a part of the first oxide semiconductor layer 4, a gate electrode 7A disposed over a part of the gate insulating layer 5A, a source electrode 8A, and a drain electrode 9A. The gate electrode 7A is disposed to cover a part of the first oxide semiconductor layer 4 with the gate insulating layer 5A sandwiched therebetween.

The first oxide semiconductor layer 4 includes a first high-resistance region 4a and first low-resistance regions 4b, located on both sides of the first high-resistance region 4a, that are lower in specific resistance than the first high-resistance region 4a. The first high-resistance region 4a may be a semiconductor region, and the first low-resistance regions 4b may be conductor regions. In the present embodiment, the first high-resistance region 4a is covered with the gate insulating layer 5A, and the first low-resistance regions 4b are not covered with the gate insulating layer 5A. Such a structure is obtained by performing a resistance lowering process on the first oxide semiconductor layer 4, for example, with the gate insulating layer 5A and the gate electrode 7A as masks.

The first high-resistance region 4a includes a first channel region 41 that, when viewed from an angle parallel with a direction normal to the principal surface of the substrate 1 (hereinafter abbreviated as "direction normal to the substrate 1"), overlaps the gate electrode 7A with the gate insulating layer 5A sandwiched therebetween and first offset regions 42 disposed on both sides of the first channel region 41. The first offset regions 42 are regions that, when viewed from an angle parallel with the direction normal to the substrate 1, overlap the gate insulating layer 5A but do not overlap the gate electrode 7A. In this example, the first offset regions 42 include source-side and drain-side offset regions 42s and 42d located on both sides, respectively, of the first channel region 41.

The first offset regions 42 have a length L1 in a channel length direction. In this example, the length L1 is a total of a length L1s of the source-side offset region 42s in the channel length direction and a length L1d of the drain-side offset region 42d in the channel length direction. The length L1s of the source-side offset region 42s is defined by a length extending from a source-side edge of the gate electrode 7A to a source-side edge of the gate insulating layer 5A in the channel length direction when viewed from an angle parallel with the direction normal to the substrate 1. Similarly, the length L1d of the drain-side offset region 42d is defined by a length extending from a drain-side edge of the gate electrode 7A to a drain-side edge of the gate insulating layer 5A in the channel length direction when viewed from an angle parallel with the direction normal to the substrate 1.

The first low-resistance regions 4b include a source contact region 44s electrically connected to the source electrode 8A and a drain contact region 44d electrically connected to the drain electrode 9A. When viewed from an angle parallel with the direction normal to the substrate 1, the drain contact region 44d is placed opposite the source contact region 44s across the first high-resistance region 4a. The first low-resistance regions 4b also include a source-side interposed region 43s located between the source contact region 44s and the first high-resistance region 4a and a drain-side interposed region 43d located between the drain contact region 44d and the first high-resistance region 4a.

The gate insulating layer 5A is disposed over a part of the first oxide semiconductor layer 4. The gate insulating layer 5A includes a first insulating film 51 and a second insulating film 52 disposed over the first insulating film 51. In this example, the gate insulating layer 5A has a laminated structure whose lower layer is the first insulating film 51 and whose upper layer is the second insulating film 52.

The first insulating film 51 and the second insulating film 52 may be made of the same material. For example, the first insulating film 51 and the second insulating film 52 may both be $SiO_2$ films. In this case too, a boundary between these insulating films can be confirmed, for example, by laminography. Alternatively, the first insulating film 51 and the second insulating film 52 may be made of different materials from each other. For example, the first insulating film 51 may be $SiO_2$ film, and the second insulating film 52 may be $SiO_xN_y$ film.

As illustrated, the first insulating film 51 of the gate insulating layer 5A may be in direct contact with an upper surface of the first high-resistance region 4a of the first oxide semiconductor layer 4. Further, the second insulating film 52 of the gate insulating layer 5A may be in direct contact with an upper surface of the first insulating film 51. In the gate insulating layer 5A, the first insulating film 51 and the second insulating film 52 may have their side surfaces aligned with each other. Such a structure may be formed by patterning the first insulating film 51 and the second insulating film 52 with the same mask.

The first oxide semiconductor layer 4, the gate insulating layer 5A, and the gate electrode 7A are covered with an interlayer insulating layer 10. The interlayer insulating layer 10 may be in direct contact with upper surfaces of the first low-resistance regions 4b of the first oxide semiconductor layer 4.

The source electrode 8A and the drain electrode 9A are disposed, for example, over the interlayer insulating layer 10. In this example, the interlayer insulating layer 10 is provided with a first opening 10As through which the source contact region 44s of the first oxide semiconductor layer 4 is exposed and a second opening 10Ad through which the drain contact region 44d is exposed. The source electrode 8A is disposed over the interlayer insulating layer 10 and in the first opening 10As, and is connected to the source contact region 44s in the first opening 10As. The drain electrode 9A is disposed over the interlayer insulating layer 10 and in the second opening 10Ad, and is connected to the drain contact region 44d in the second opening 10Ad.

The first TFT 100 may further include, between the first oxide semiconductor layer 4 and the substrate 1, a lower conductive layer 2A functioning as a light-blocking layer. The lower conductive layer 2A is covered with a lower insulating layer 3. The first oxide semiconductor layer 4 is disposed over the lower conductive layer 2A with the lower insulating layer 3 sandwiched therebetween. The lower conductive layer 2A may be disposed to overlap at least the first channel region 41 of the first oxide semiconductor layer 4 when viewed from an angle parallel with the direction normal to the substrate 1. This makes it possible to reduce deterioration in characteristic of the first oxide semiconductor layer 4 attributed to light (backlight) from the direction of the substrate 1. When viewed from an angle parallel with the direction normal to the substrate 1, the lower conductive layer 2A may at least partially overlap the first offset regions 42 of the first oxide semiconductor layer 4 or, for example, may wholly overlap the first high-resistance region 4a. By partially or wholly shielding the first offset regions 42 from light, the first offset regions 42 can be inhibited from becoming lower in resistance due to deterioration by light. This makes it possible to hold down an increase in off-leak current.

In a case where the first TFT 100 is used as the pixel transistor Tp (pixel TFT) shown in FIG. 1, the gate electrode 7A is electrically connected to the corresponding one of the gate bus lines GL. The gate electrode 7A may be formed integrally with the corresponding one of the gate bus lines GL using the same conducting film as the gate bus lines GL. The source electrode 8A is electrically connected to the corresponding one of the source bus lines SL. The source electrode 8A may be formed integrally with the corresponding one of the source bus lines SL using the same conducting film as the source bus lines SL. The drain electrode 9A is electrically connected to the corresponding pixel electrode PE.

Meanwhile, as with the first TFT 100, the second TFT 200 includes the second oxide semiconductor layer 6, a gate insulating layer 5B disposed over a part of the second oxide semiconductor layer 6, a gate electrode 7B disposed over a part of the gate insulating layer 5B, a source electrode 8B, and a drain electrode 9B.

The gate insulating layer 5B of the second TFT 200 differs from the gate insulating layer 5A of the first TFT 100 in that the gate insulating layer 5B includes the second insulating film 52 but does not include the first insulating film 51. In this example, the gate insulating layer 5B is thinner than the gate insulating layer 5A by the thickness of the first insulating film 51. The gate insulating layer 5B may be composed solely of the second insulating film 52. The second insulating film 52 of the gate insulating layer 5B may be in direct contact with a part (i.e. the upper surface of the first high-resistance region 4a) of an upper surface of the first oxide semiconductor layer 4.

A first insulating layer 5C including the first insulating film 51 may be provided between the second oxide semiconductor layer 6 and the substrate 1. That is, the second oxide semiconductor layer 6 may be located between the first insulating layer 5C and the gate insulating layer 5B. In other words, the second oxide semiconductor layer 6 may be located between the first insulating film 51 and the second insulating film 52. The first insulating layer 5C may have its side surfaces aligned with side surfaces of the second oxide semiconductor layer 6. Such a configuration is obtained by patterning the first insulating film 51 with the second oxide semiconductor layer 6 as a mask.

The second insulating film 52 serving as an upper layer of the gate insulating layer 5A of the first TFT 100 and the second insulating film 52 included in the gate insulating layer 5B of the second TFT 200 are herein formed from the same insulating film (i.e. are the same layer). Similarly, the first insulating film 51 serving as a lower layer of the gate insulating layer 5A of the first TFT 100 and the first insulating film 51 included in the first insulating layer 5C located on the side of the second oxide semiconductor layer 6 that faces the substrate 1 are the same layer.

As with the first oxide semiconductor layer 4 of the first TFT 100, the second oxide semiconductor layer 6 includes a second high-resistance region 6a covered with the gate insulating layer 5B and second low-resistance regions 6b, located on both sides of the second high-resistance region 6a, that are not covered with the gate insulating layer 5B.

The second high-resistance region 6a includes a second channel region 61 overlapping the gate electrode 7B when viewed from an angle parallel with the direction normal to the substrate 1 and second offset regions 62 that, when viewed from an angle parallel with the direction normal to the substrate 1, overlap the gate insulating layer 5B but do not overlap the gate electrode 7B. The second offset regions 62 include a source-side offset region 62s and a drain-side offset region 62d. Meanwhile, the second low-resistance regions 6b include a source contact region 64s electrically connected to the source electrode 8B, a drain contact region 64d electrically connected to the drain electrode 9B, a source-side interposed region 63s located between the source contact region 64s and the second high-resistance region 6a and a drain-side interposed region 63d located between the drain contact region 64d and the second high-resistance region 6a.

The second offset regions 62 have a length L2 in a channel length direction. In this example, the length L2 is a total of a length L2s of the source-side offset region 62s in the channel length direction and a length L2d of the drain-side offset region 62d in the channel length direction. The length L2s of the source-side offset region 62s is defined by a length extending from a source-side edge of the gate electrode 7B to a source-side edge of the gate insulating layer 5B in the channel length direction when viewed from an angle parallel with the direction normal to the substrate 1. Similarly, the length L2d of the drain-side offset region 62d is defined by a length extending from a drain-side edge of the gate electrode 7B to a drain-side edge of the gate insulating layer 5B in the channel length direction when viewed from an angle parallel with the direction normal to the substrate 1.

In the present embodiment, the length L2 of the second offset regions 62 in the second TFT 200 is smaller than the length L1 of the first offset regions 42 in the first TFT 100. As illustrated, the lengths L2s and L2d of the source-side and drain-side offset regions of the second TFT 200 may be smaller than the lengths L1s and L1d of the source-side and drain-side offset regions in the first TFT 100, respectively.

The second oxide semiconductor layer 6, the gate insulating layer 5B, and the gate electrode 7B are covered with the interlayer insulating layer 10. The interlayer insulating layer 10 may be in direct contact with upper surface of the second low-resistance regions 6b of the second oxide semiconductor layer 6.

The source electrode 8B and the drain electrode 9B are disposed, for example, over the interlayer insulating layer 10. In this example, as in the case of the first TFT 100, the source electrode 8B is connected to the source contact region 64s in a first opening 10Bs formed in the interlayer insulating layer 10. The drain electrode 9B is connected to the drain contact region 64d in a second opening 10Bd formed in the interlayer insulating layer 10.

As with the first TFT 100, the second TFT 200 may further include, between the second oxide semiconductor layer 6 and the substrate 1, a lower conductive layer 2B functioning as a light-blocking layer. The lower conductive layer 2B is covered with the lower insulating layer 3. As illustrated, the first insulating layer 5C may be disposed over the lower insulating layer 3, and the second oxide semiconductor layer 6 may be disposed over the first insulating layer 5C. As with the light-blocking layer of the first TFT 100, the lower conductive layer 2B may be disposed to overlap at least the second channel region 61 of the second oxide semiconductor layer 6 when viewed from an angle parallel with the direction normal to the substrate 1. When viewed from an angle parallel with the direction normal to the substrate 1, the lower conductive layer 2B may at least partially overlap the second offset regions 62 of the second oxide semiconductor layer 6 or, for example, may wholly overlap the second high-resistance region 6a.

The gate electrodes 7A and 7B of the first and second TFTs 100 and 200 may be formed from the same conducting film (gate conducting film), and the source electrodes 8A and 8B and the drain electrodes 9A and 9B may be formed from the same conducting film (source conducting film). Further, the lower conductive layers 2A and 2B may both be formed from the same conducting film (lower conducting film).

The structures of the first and second TFTs 100 and 200 are not limited to the structures shown in FIGS. 2A and 2B.

Although, in the illustrated example, the source the length L1s of the source-side offset region 42s and the length L1d of the drain-side offset region 42d in the first TFT 100 are substantially the same, these lengths may be different from each other (asymmetric structure). Similarly, the source the lengths L2s and Ltd of the source-side and drain-side offset region 62s and 62d in the second TFT 200 too may be different from each other.

In the first TFT 100 and the second TFT 200, the lower conductive layers 2A and 2B may be in an electrically floating state, or may be fixed at a GND potential (0 V). Alternatively, the lower conductive layers 2A and 2B may function as lower gate electrodes by being electrically connected to the gate electrodes 7A and 7B through connections (not illustrated), respectively (double-gate structure). This makes it possible to further increase the on-currents. For example, in the second TFT 200, the lower conductive layer 2B may function as a lower gate electrode by being provided to at least partially overlap the second offset regions 62 when viewed from an angle parallel with the direction normal to the substrate 1. This causes the second offset regions 62 to have their resistances lowered by the application of a predetermined voltage to the lower gate electrode when the second TFT 200 is turned on. This makes it possible to further increase the on-current.

Further, in the first TFT 100 and/or the second TFT 200, at least either the source electrode(s) and the drain electrode(s) may be provided closer to the substrate 1 than the first oxide semiconductor layer 4 and/or the second oxide semiconductor layer 6. For example, at least either the source electrodes and the drain electrodes may be formed using the same conducting film as the lower conductive layers 2A and 2B and electrically connected to the corresponding oxide semiconductor layers in openings formed in the lower insulating layer 3.

Furthermore, the planar shapes, sizes, channel lengths, channel widths, or other attributes of the layers of the first and second TFTs 100 and 200 need only be set depending on the uses of the TFTs, and may be different from each other.

Effects

In the present embodiment, as shown in Table 1, the first TFT 100 and the second TFT 200 are different in (i) Oxide Semiconductor Material, (ii) Structure of Gate Insulating Layer, and (iii) Length of Offset Region from each other. This allows the first TFT 100 and the second TFT 200 to be different in characteristic from each other. In this example, the second TFT 200 may have higher TFT mobility than the first TFT 100. In Table 1, "Large", "Small", "High", and "Low" represent relative magnitude relationships in comparison with the other TFT.

TABLE 1

| | (i) Mobility of Oxide Semiconductor Material | (ii) Structure of Gate Insulating Layer | (iii) Length of Offset Region | Off-leak Current | TFT Mobility |
|---|---|---|---|---|---|
| 1st TFT | Low | Laminated Film of Second Insulating Film/First Insulating Film (Gate Capacitance: Small) | Large | Small | Low |
| 2nd TFT | High | Second Insulating Film Alone (Gate Capacitance: Large) | Small | Large | High |

Figure 3:
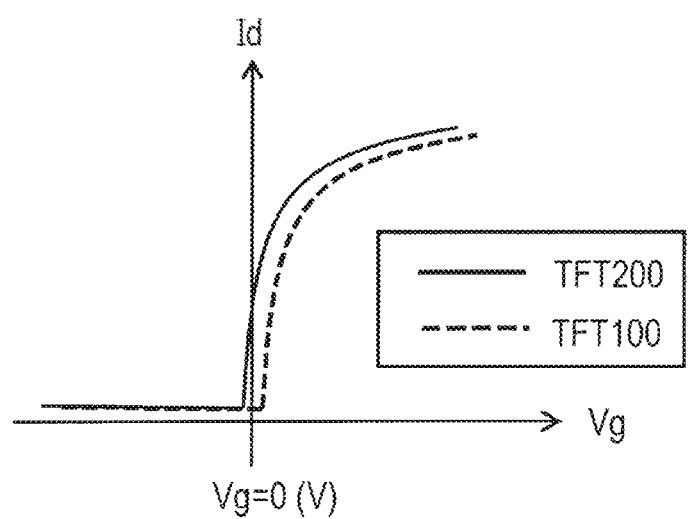
FIG. 3 is a diagram illustrating Vg-Id characteristics of the first and second TFTs.

FIG. 3 is a diagram illustrating Vg-Id characteristics of the first TFT 100 and the second TFT 200. The horizontal axis of the graph represents the potential (gate-drain voltage) Vdg of each of the gate electrodes based on the potential of a corresponding one of the drain electrodes, and the vertical axis of the graph represents the drain current Id.

It is found from FIG. 3 that the second TFT 200 has a threshold voltage which is higher in a positive direction than that of the first TFT 100. A possible reason for this is that as mentioned above, the differences in material and structure shown in Table 1 have made the second TFT 200 higher in TFT mobility than the first TFT 100 and thereby caused the threshold voltage to shift in a positive direction.

The first TFT 100, whose off-leak current is small, is suitably used as a pixel TFT. The pixel TFT may have an enhancement characteristic whose threshold voltage is positive, or may have a depression characteristic whose threshold voltage is negative. Further, in a case where the first TFT 100 has an enhancement characteristic, the first TFT 100 may be suitably used as a circuit TFT such as a drive circuit TFT. This makes it possible to reduce power consumption. This also makes it possible to reduce circuit malfunctions and reduce deterioration in yield. Furthermore, the first TFT 100 may be used as an inspection TFT or an ESD protection TFT.

The second TFT 200 is suitably used, for example, as a circuit TFT such as an SSD circuit TFT. The second TFT 200 has higher TFT mobility than the first TFT 100, and is superior in current drive force (on-current). Further, the second TFT 200 is capable of a shorter channel, and can have a reduced circuit area.

Alternatively, a drive circuit may include a mixture of first TFTs 100 and second TFTs 200. For example, a gate drive circuit may include a plurality of TFTs including high-mobility second TFTs 200 used as at least TFTs called "output transistors (also referred to as buffer transistors)" (described later with reference to FIG. 9) and first TFTs 100 used as other TFTs.

Table 2 illustrates suitable characteristics of a pixel TFT, a drive circuit TFT, and an SSD circuit TFT in a liquid crystal display device. The characteristics and numerical ranges described in Table 2 are merely examples, and are not intended to limit the characteristics of the TFTs.

TABLE 2

| Use of TFT | Pixel TFT | Drive Circuit TFT | SSD Circuit TFT Output Transistor of Drive Circuit TFT |
|---|---|---|---|
| Threshold Voltage | Depression to Enhancement −1 V or higher | Enhancement 0 V or higher | SSD Circuit TFT Capable of Depression −2 V or higher |
| TFT Mobility | Low to Middle 5 cm$^2$/Vs or higher 20 cm$^2$/Vs or lower | Low to Middle 5 cm$^2$/Vs or higher 20 cm$^2$/Vs or lower | High 20 cm$^2$/Vs or higher |
| TFT Structure | First TFT 100 | First TFT 100 | Second TFT 200 |

According to the present embodiment, the characteristics of the first and second TFTs 100 and 200 can be controlled independently of each other. First, suitable oxide semiconductor materials can be selected separately for each of the first and second TFTs 100 and 200. Second, the thicknesses of the gate insulating layers 5A and 5B of the TFTs can be controlled independently of each other. Specifically, the thickness of the gate insulating layer 5B of the second TFT 200 can be controlled by the thickness of the second insulating film 52. Since the thickness of the gate insulating layer 5A of the first TFT 100 is a total thickness of the first insulating film 51 and the second insulating film 52, the thickness of the gate insulating layer 5A of the first TFT 100 can be controlled by adjusting the thickness of the first insulating film 51. Third, the lengths L1 and L2 of the offset regions of the TFTs can be controlled, for example, by the thicknesses of the first and second insulating films 51 and 52, conditions for etching of these insulating films, or other conditions.

Furthermore, the present embodiment makes it possible to fabricate TFTs of different characteristics depending on the purposes while holding down an increase in the number of manufacturing steps. Specifically, as will be described in detail later, after the first oxide semiconductor layer 4 of the first TFT 100 has been formed, the first insulating film 51, the second oxide semiconductor layer 6 of the second TFT 200, and the second insulating film 52 are formed in this order. After this, the first insulating film 51 and the second insulating film 52 are patterned. This causes a gate insulating layer 5A including the first insulating film 51 and the second insulating film 52 to be formed over the first oxide semiconductor layer 4. A gate insulating layer 5B including the second insulating film 52 and not including the first insulating film 51 is formed over the second oxide semiconductor layer 6. The gate insulating layers 5A and 5B may be formed by patterning the first insulating film 51 and the second insulating film 52 with the same etching mask. In this case, since the gate insulating layer 5A is thicker than the gate insulating layer 5B, the length in the channel length direction of a taper shape that is formed on a side surface of the gate insulating layer 5A (taper length) is greater than that of the gate insulating layer 5B. As a result, the length L1 of the offset regions of the first TFT 100 can be made greater than the length L2 of the offset regions of the second TFT 200 by the difference in taper length between the gate insulating layers 5A and 5B.

Furthermore, a conventional method has a risk that in a case where oxide semiconductor layers of two TFTs are formed as separate layers, the oxide semiconductor layer formed earlier may be damaged in a later step of forming another oxide semiconductor layer. On the other hand, the aforementioned method makes it possible to form the second oxide semiconductor layer 6 (i.e. deposit and pattern the high-mobility oxide semiconductor film) with the first oxide semiconductor layer 4 wholly covered with the first insulating film 51. This allows the first oxide semiconductor layer 4 to be damaged less in a later step.

Regarding High-Mobility Oxide Semiconductor Film and Low-Mobility Oxide Semiconductor Film The low-mobility oxide semiconductor film used as the first oxide semiconductor layer 4 of the first TFT 100 and the high-mobility oxide semiconductor film used as the second oxide semiconductor layer 6 of the second TFT 200 are not particularly limited, for example, in composition, thickness, crystal structure, or how they are formed. The high-mobility oxide semiconductor film and the low-mobility oxide semiconductor film may each be a single-layer film, or may each be a laminated film including a plurality of oxide semiconductor films. The mobility of the high-mobility oxide semiconductor film (in a case where the high-mobility oxide semiconductor film is a laminated film, the mobility of the laminated film as a whole) needs only be higher than the mobility of the low-mobility oxide semiconductor film.

The high-mobility oxide semiconductor film and the low-mobility oxide semiconductor film may be different in composition from each other. The phrase "different in composition" means that the layers contain different types of metallic element or contain metallic elements at different composition ratios. For example, the high-mobility oxide semiconductor film and the low-mobility oxide semiconductor film may each contain In and/or Sn, and a total of atomic-number ratios of In and Sn with respect to all metallic elements in the high-mobility oxide semiconductor film may be greater than a total of atomic-number ratios of In and Sn with respect to all metallic elements in the low-mobility oxide semiconductor film.

For example, the high-mobility oxide semiconductor film and the low-mobility oxide semiconductor film may both be In—Ga—Zn—O oxide semiconductor layers, and the atomic-number ratio of In in the low-mobility oxide semiconductor film may be lower than the atomic-number ratio of In in the high-mobility oxide semiconductor film. Alternatively, the atomic-number ratio of Ga in the low-mobility oxide semiconductor film may be higher than the atomic-number ratio of Ga in the high-mobility oxide semiconductor film.

Further, the high-mobility oxide semiconductor film contains Sn, and the low-mobility oxide semiconductor film does not need to contain Sn. Alternatively, the low-mobility oxide semiconductor film may contain Sn at a lower concentration than the high-mobility oxide semiconductor film. That is, the atomic-number ratio of Sn with respect to all metallic elements in the low-mobility oxide semiconductor film may be lower than the atomic-number ratio of Sn in the high-mobility oxide semiconductor film.

A usable example of the low-mobility oxide semiconductor film is an In—Ga—Zn—O semiconductor film (such as In:Ga:Zn=1:1:1) Usable examples of the high-mobility oxide semiconductor film include an In—Ga—Zn—O semiconductor film (such as In:Ga:Zn=5:1:4), an In—Sn—Zn—O semiconductor film, an In—Al—Sn—Zn—O semiconductor film, an In—W—Zn—O semiconductor film, an In—Sn—O semiconductor film, an In—Zn—O semiconductor film, an In—Ga—Sn—O semiconductor film, and an In—Sn—Ti—Zn—O semiconductor film.

Further, the low-mobility oxide semiconductor film and the high-mobility oxide semiconductor film may have crystal structures differing from each other. For example, one of these oxide semiconductor films may be an amorphous oxide semiconductor film, and the other oxide semiconductor film may be a crystalline oxide semiconductor film containing a crystalline portion.

Furthermore, even in a case where metallic elements are equal in ratio, the mobility of an oxide semiconductor film can be changed by changing film-forming methods and film-forming conditions. For example, an atmosphere in a chamber in which an oxide semiconductor film is formed by sputtering (e.g. flow-rate ratios of oxygen and Ar that are fed into the chamber) may be changed. Specifically, when the low-mobility oxide semiconductor film is formed, the flow-rate ratio of oxygen with respect to Ar may be set high (e.g. 80%), and when the high-mobility oxide semiconductor film is formed, the flow-rate ratio of oxygen with respect to Ar may be set lower (e.g. 20%) than in the case of the low-mobility oxide semiconductor film.

The low-mobility oxide semiconductor film and the high-mobility oxide semiconductor film may be substantially equal in thickness to each other, or may be different in thickness from each other. The high-mobility oxide semiconductor film may be thinner than the low-mobility oxide semiconductor film. Alternatively, the high-mobility oxide semiconductor film may be thicker than the low-mobility oxide semiconductor film. The thickness of the high-mobility oxide semiconductor film may for example be greater than or equal to 5 nm and smaller than or equal to 50 nm. The thickness of the low-mobility oxide semiconductor film may for example be greater than or equal to 10 nm and smaller than or equal to 100 nm.

Method for Manufacturing Active Matrix Substrate 1000

The following describes an example of a method for manufacturing an active matrix substrate by taking as an example an active matrix substrate that is applied to a liquid crystal display device of the FFS mode.

FIGS. 4A to 4P and FIGS. 5A to 5C are step cross-sectional views for explaining a method for manufacturing an active matrix substrate 1000.

In the example illustrated here, a first TFT 100 serving as a pixel TFT and a second TFT 200 serving as a circuit TFT that constitutes a peripheral circuit are formed in each pixel area PIX. The second TFT 200 is used, for example, in an SSD circuit. The example illustrated here is not intended to limit the purposes for which the TFTs can be used. The following description assumes that a "first TFT formation region r1" is a region in which a first TFT 100 (pixel TFT) is formed and a "second TFT formation region r2" is a region in which a second TFT 200 (circuit TFT) is formed. Although the active matrix substrate 1000 has a plurality of pixel TFTs and a plurality of circuit TFTs, only a single pixel TFT and a single circuit TFT are illustrated here.

Figure 4A:
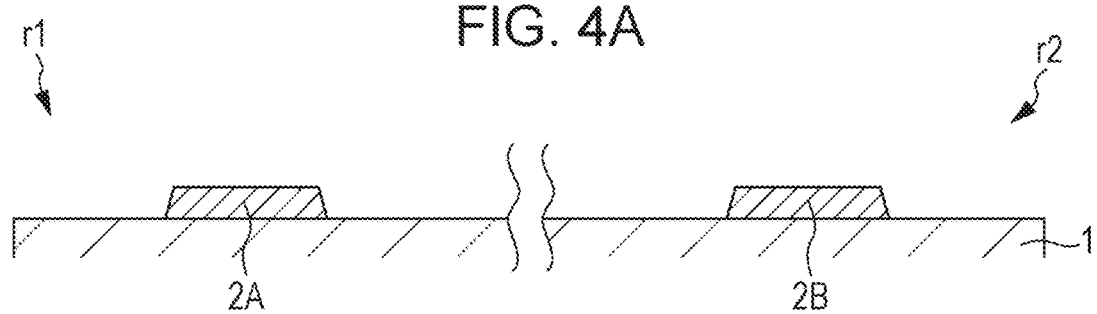
FIG. 4A is a step cross-sectional view showing a first method for manufacturing the active matrix substrate.

Step 1: Formation of Lower Conductive Layer (FIG. 4A)

A lower conducting film (whose thickness is for example greater than or equal to 50 nm and smaller than or equal to 500 nm) is formed, for example, by sputtering on the substrate 1. Next, the lower conducting film is patterned by a publicly-known photolithography step. In this way, as shown in FIG. 4A, the lower conductive layer 2A is formed in the first TFT formation region r1, and the lower conductive layer 2B is formed in the second TFT formation region r2.

Usable examples of the substrate 1 include a transparent insulating substrate such as a glass substrate, a silicon substrate, and a heat-resistant plastic substrate (resin substrate).

The lower conducting film is not particular material but can be made of a metal such as aluminum (Al), tungsten (W), molybdenum (Mo), tantalum (Ta), chromium (Cr), titanium (Ti), or copper (Cu), an alloy thereof, or a film containing a metal nitride thereof as appropriate. Alternatively, the lower conducting film may be a laminated film obtained by stacking such films.

The lower conducting film used here is a single-layer film made of a metal film (including an alloy film) containing Cu or Al. Alternatively, the lower conducting film used here may be a laminated film whose uppermost layer is a metal layer containing Cu or Al.

Step 2: Formation of Lower Insulating Layer 3 (FIG. 4B)

Figure 4B:
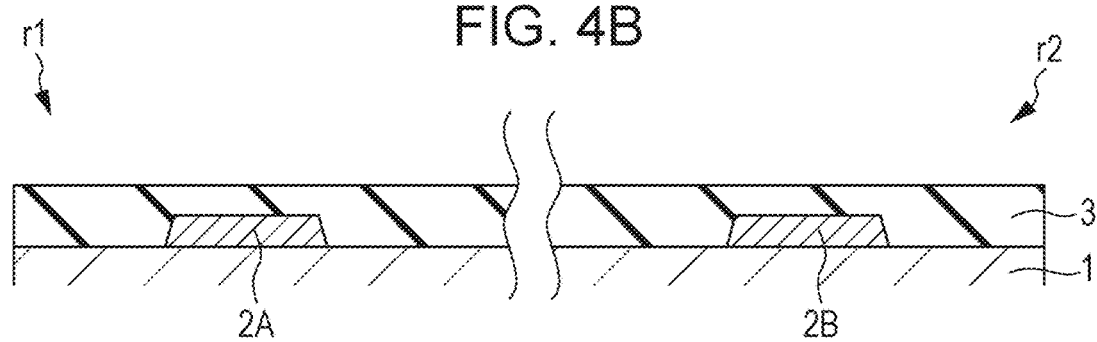
FIG. 4B is a step cross-sectional view showing the first method for manufacturing the active matrix substrate.

Next, as shown in FIG. 4B, the lower insulating layer 3 (whose thickness is for example greater than or equal to 200 nm and smaller than or equal to 600 nm) is formed to cover the lower conductive layers 2A and 2B.

The lower insulating layer 3 is formed, for example, by CVD. As the lower insulating layer 3, a silicon oxide (SiOx) layer, a silicon nitride (SiNx) layer, a silicon oxynitride (SiOxNy; x>y) layer, a silicon nitroxide (SiNxOy; x>y) layer, or other layers can be used as appropriate. The lower insulating layer 3 may be a single layer, or may have a laminated structure. For example, a silicon nitride (SiNx) layer, a silicon nitroxide layer, or other layers may be formed on a substrate side (i.e. as a lower layer) for the purpose of inhibiting impurities or other substances from diffusing from the substrate 1, and a silicon oxide ($SiO_2$) layer, a silicon oxynitride layer, or other layers may be formed over the lower layer (i.e. as an upper layer) for the purpose of ensuring insulation properties.

Figure 4C:
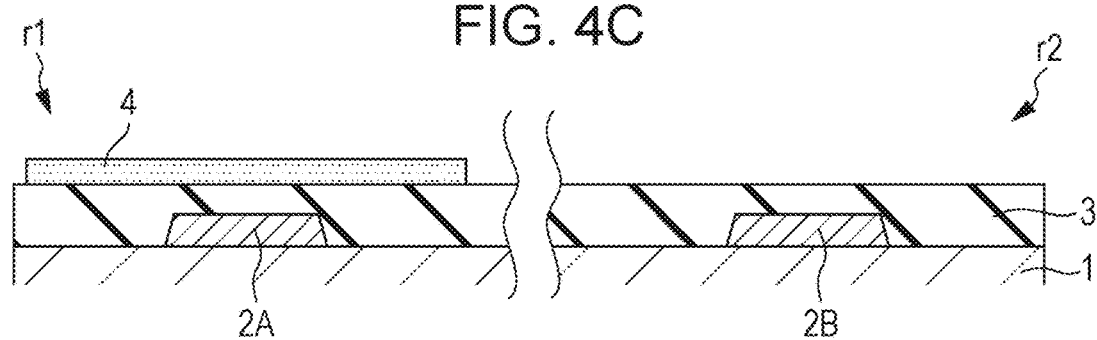
FIG. 4C is a step cross-sectional view showing the first method for manufacturing the active matrix substrate.

Step 3: Formation of First Oxide Semiconductor Layer 4 (FIG. 4C)

Next, a low-mobility oxide semiconductor film is formed over the lower insulating layer 3, and the low-mobility oxide semiconductor film is patterned. As a result, as shown in FIG. 4C, the first oxide semiconductor layer 4, which is to serve as the active layer of the first TFT 100, is formed in the first TFT formation region r1. A portion of the low-mobility oxide semiconductor film located in the second TFT formation region r2 is removed.

The low-mobility oxide semiconductor film may be formed, for example, by sputtering. The low-mobility oxide semiconductor film formed here is an In—Ga—Zn—O semiconductor film (e.g. In:Ga:Zn=1:1:1 or 4:2:4) having a thickness of 40 nm.

The patterning of the low-mobility oxide semiconductor film may be performed by either dry etching or wet etching. In the case of wet etching, a PAN etching solution or an oxalic etching solution can be used when the low-mobility oxide semiconductor film is an In—Ga—Zn—O semiconductor film.

Step 4: Formation of Insulating Film 510 (FIG. 4D)

Figure 4D:
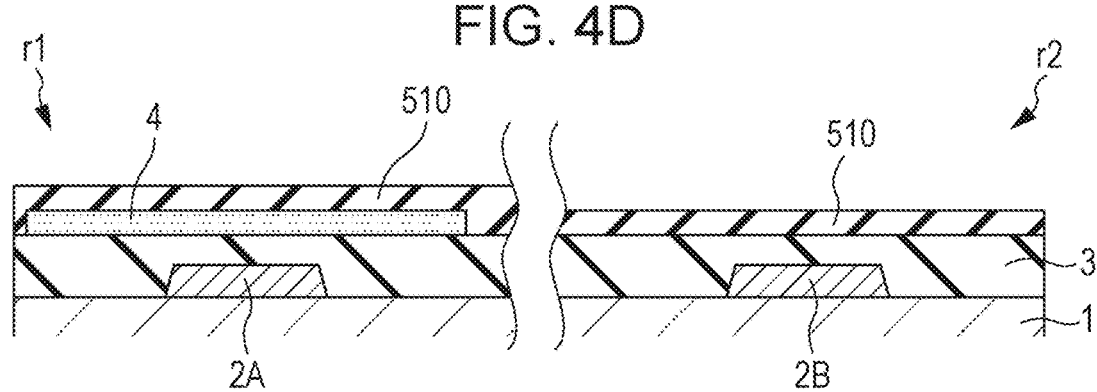
FIG. 4D is a step cross-sectional view showing the first method for manufacturing the active matrix substrate.

Next, as shown in FIG. 4D, the insulating film 510, which is to serve as the first insulating film 51, is formed to cover the first oxide semiconductor layer 4. The insulating film 510 may be formed, for example, by CVD.

As the insulating film 510, an insulating film similar to the lower insulating layer 3 (i.e. an insulating film taken as an example of the lower insulating layer 3) can be used. The insulating film 510 formed here is a silicon oxide ($SiO_2$) film. Using an oxide film such as a silicon oxide film as the insulating film 510 makes it possible to inhibit the channel regions of the TFTs from becoming lower in resistance, as the oxide film can reduce oxidative defects in the channel regions. The thickness of the insulating film 510 may for example be greater than or equal to 20 nm and smaller than or equal to 200 nm. The thickness of the insulating film 510 may be set, for example, so that the thickness of the gate insulating layer 5A of the first TFT 100 (i.e. the total thickness of the first insulating film 51 and the second insulating film 52) is greater than or equal to 100 nm and smaller than or equal to 450 nm.

Step 5: Formation of Second Oxide Semiconductor Layer 6 (FIG. 4E)

Figure 4E:
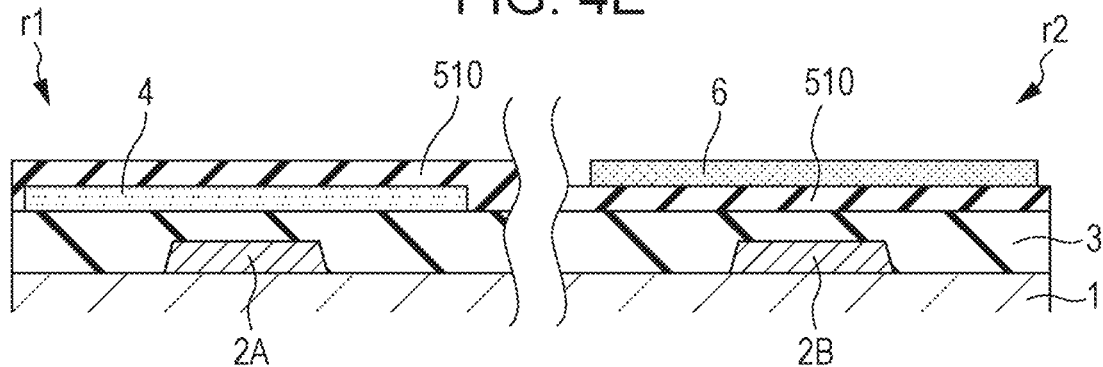
FIG. 4E is a step cross-sectional view showing the first method for manufacturing the active matrix substrate.

Next, as shown in FIG. 4E, a high-mobility oxide semiconductor film is formed over the insulating film 510, and the high-mobility oxide semiconductor film is patterned. As a result, as shown in FIG. 4E, the second oxide semiconductor layer 6, which is to serve as the active layer of the second TFT 200, is formed in the second TFT formation region r2. A portion of the high-mobility oxide semiconductor film located in the first TFT formation region r1 is removed.

The high-mobility oxide semiconductor film may be formed, for example, by sputtering. The high-mobility oxide semiconductor film formed here is an In—Ga—Zn—O semiconductor film (e.g. In:Ga:Zn=5:1:4) having a thickness of 35 nm. Alternatively, the high-mobility oxide semiconductor film formed here may be a Sn-containing film such as an In—Sn—Zn—O semiconductor film (e.g. $In_2O_3$—$SnO_2$—ZnO) having a thickness of 35 nm. The high-mobility oxide semiconductor film may be a laminated film containing a high-mobility material.

The patterning of the high-mobility oxide semiconductor film may be performed by either dry etching or wet etching. In the case of wet etching, a PAN etching solution or an oxalic etching solution can be used when the high-mobility oxide semiconductor film is an In—Ga—Zn—O semiconductor film. An oxalic etching solution can be used when the high-mobility oxide semiconductor film is an In—Sn—Zn—O semiconductor film.

The patterning of the high-mobility and low-mobility oxide semiconductor films may be preceded or followed by annealing of these oxide semiconductor films.

Step 6: Formation of Insulating Film 520 (FIG. 4F)

Figure 4F:
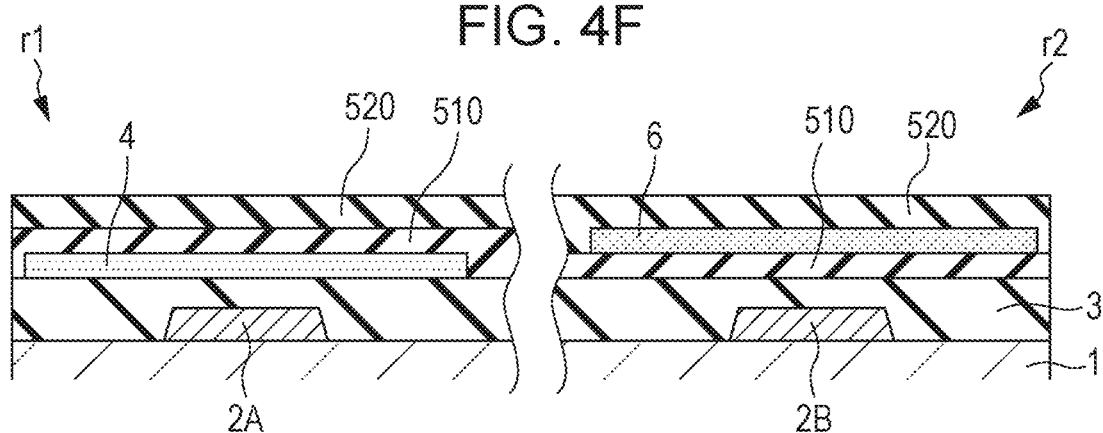
FIG. 4F is a step cross-sectional view showing the first method for manufacturing the active matrix substrate.

Next, as shown in FIG. 4F, an insulating film (sometimes referred to as "different insulating film") 520 to serve as the second insulating film 52 is formed over the second oxide semiconductor layer 6 and the insulating film 510. The insulating film 520 may be formed, for example, by CVD.

As the insulating film 520 too, an insulating film similar to the lower insulating layer 3 (i.e. an insulating film taken as an example of the lower insulating layer 3) can be used, as is the case with the insulating film 510. The insulating film 520 may be an insulating film made of the same material as the insulating film 510. The insulating film 520 formed here is a silicon oxide ($SiO_2$) film. The thickness of the insulating film 520 may for example be greater than or equal to 80 nm and smaller than or equal to 250 nm. The thickness of the insulating film 520 defines the thickness of the gate insulating layer 5B of the second TFT 200.

The insulating film 520 may be made of a material which is different from that of which the insulating film 510 is made. For example, a $SiO_2$ film may be formed as the insulating film 510, and a SiOxNy film may be formed as the insulating film 520. This makes it possible to further increase the gate capacitance of the second TFT 200.

Step 7: Formation of Gate Conducting Film 70 (FIG. 4G)

Figure 4G:
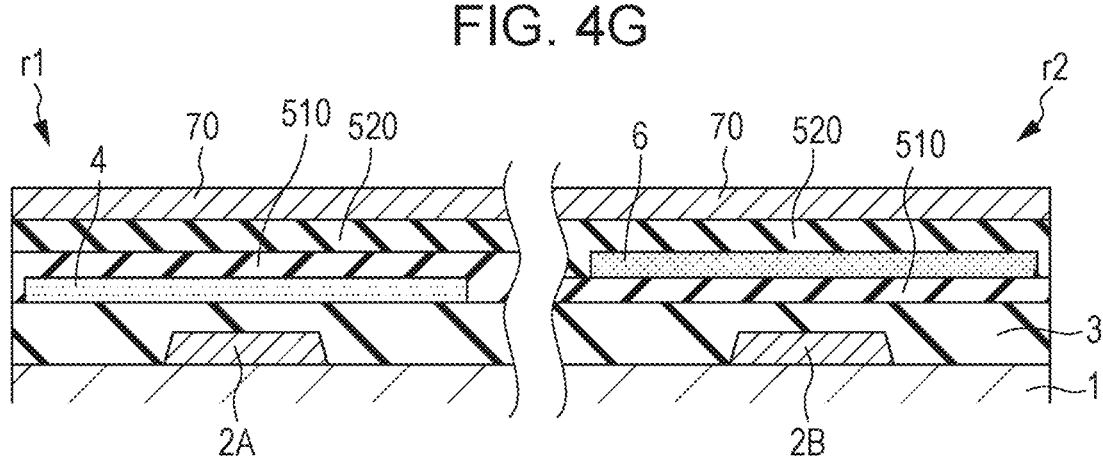
FIG. 4G is a step cross-sectional view showing the first method for manufacturing the active matrix substrate.

Next, as shown in FIG. 4G, a gate conducting film (whose thickness is for example greater than or equal to 50 nm and smaller than or equal to 500 nm) 70 is formed over the insulating film 520.

The gate conducting film 70 can be made of a metal such as molybdenum (Mo), tungsten (W), aluminum (Al), copper (Cu), titanium (Ti), or tantalum (Ta) or an alloy thereof. The gate conducting film 70 may have a laminated structure including a plurality of layers formed from different electrical conducting materials. The gate conducting film 70 used here is a Cu/Cu alloy laminated film whose lower layer is a Cu alloy film and whose upper layer is a Cu film. Alternatively, the gate conducting film 70 used here may be a Cu/Ti laminated film or a Cu/Mo laminated film.

Figure 4H:
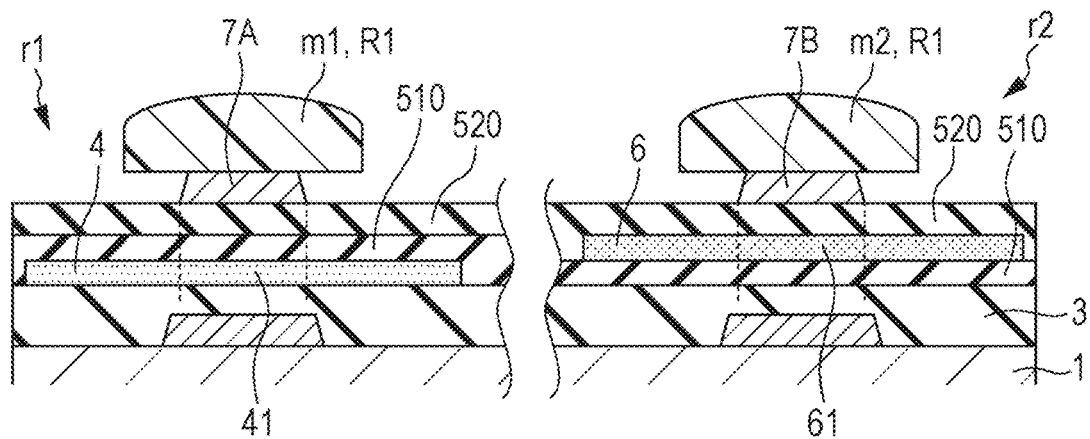
FIG. 4H is a step cross-sectional view showing the first method for manufacturing the active matrix substrate.

Step 8: Formation of Gate Electrodes 7A and 7B (FIG. 4H)

Then, a first resist layer R1 is formed over a part of the gate conducting film 70. Specifically, first, a resist film is formed over the gate conducting film 70. Next, the first resist layer R1 is obtained by exposing the resist film with a gate metal photomask and then developing the resist film. The first resist layer R1 includes a first mask portion m1 located in the first TFT formation region r1 and a second mask portion m2 located in the second TFT formation region r2.

After this, the gate conducting film 70 is etched with the first resist layer R1 as a mask. As a result, as shown in FIG. 4H, the gate electrode 7A is formed in the first TFT formation region r1, and the second gate electrode 7B is formed in the second TFT formation region r2. Although not illustrated, gate bus lines too are formed using the gate conducting film 70. A portion of the first oxide semiconductor layer 4 overlapping the gate electrode 7A when viewed from an angle parallel with the direction normal to the substrate 1 serves as the "first channel region 41", and a portion of the second oxide semiconductor layer 6 overlapping the gate electrode 7B when viewed from an angle parallel with the direction normal to the substrate 1 serves as the "second channel region 61".

The etching of the gate conducting film 70 may involve the use of, for example, a hydrogen peroxide etching solution. In this example, a long etching time is taken (for overetching) so that the widths (i.e. lengths in the channel length direction) of the gate electrodes 7A and 7B are smaller than the widths of the mask portions m1 and m2, respectively.

Step 9: Patterning of Insulating Films 510 and 520 (FIG. 4I and FIGS. 5A to 5C)

Figure 4I:
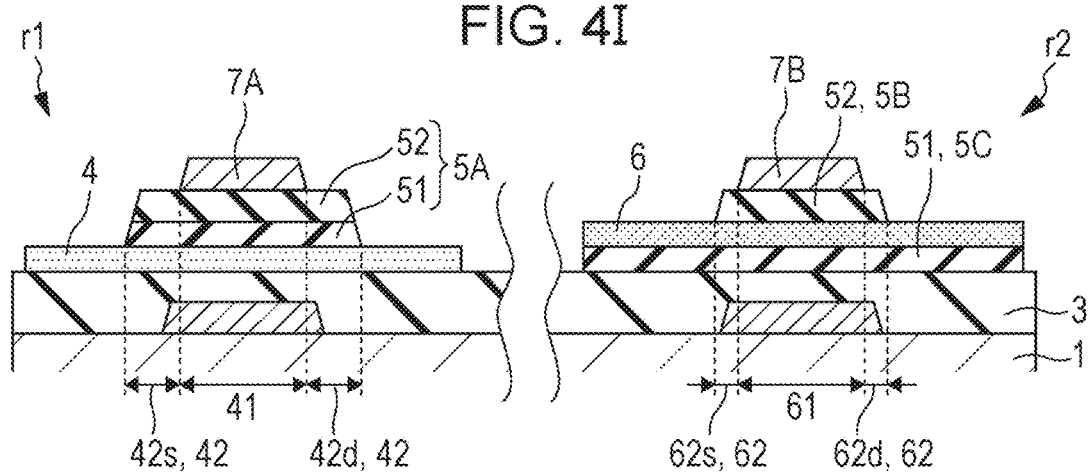
FIG. 4I is a step cross-sectional view showing the first method for manufacturing the active matrix substrate.

Next, the insulating films 510 and 520 are patterned, whereby the second insulating film 52 is obtained from the insulating film 520 and the first insulating film 51 is obtained from the insulating film 510. As a result, as shown in FIG. 4I, the gate insulating layer 5A of the first TFT 100, the gate insulating layer 5B of the second TFT 200, and the first insulating layer 5C are formed. Portions of the first oxide semiconductor layer 4 adjacent to the first channel region 41 and covered with the gate insulating layer 5A serve as the "first offset regions 42", and portions of the second oxide semiconductor layer 6 adjacent to the second channel region 61 and covered with the gate insulating layer 5B serve as the "second offset regions 62".

Figure 5A:
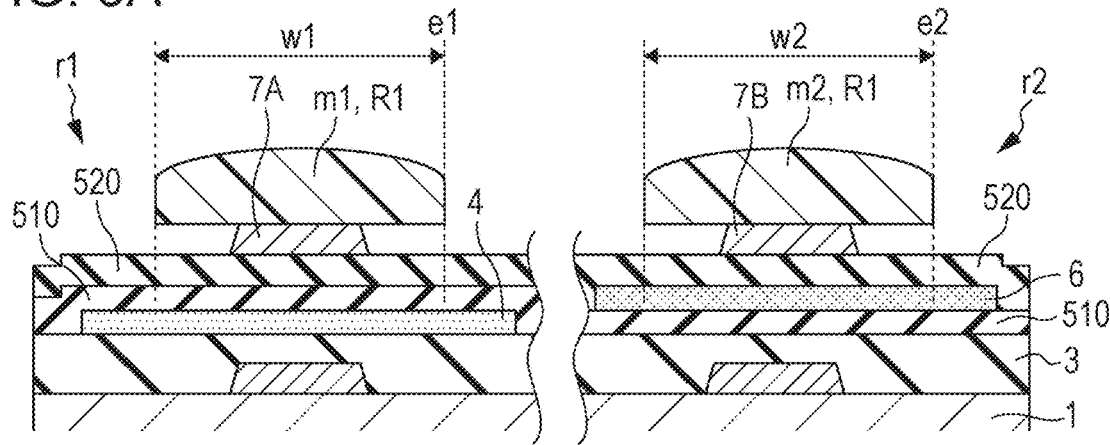
FIG. 5A is a step cross-sectional view showing the first method for manufacturing the active matrix substrate.
Figure 5B:
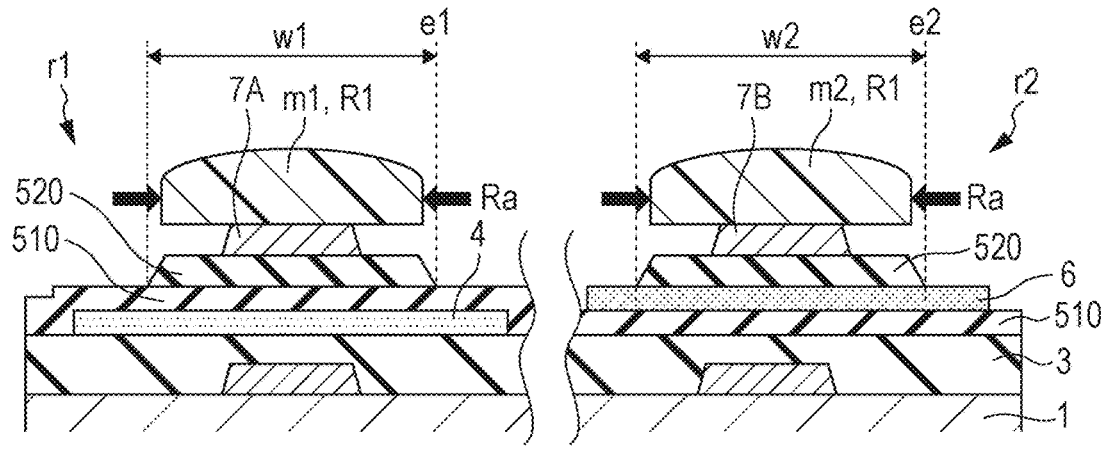
FIG. 5B is a step cross-sectional view showing the first method for manufacturing the active matrix substrate.
Figure 5C:
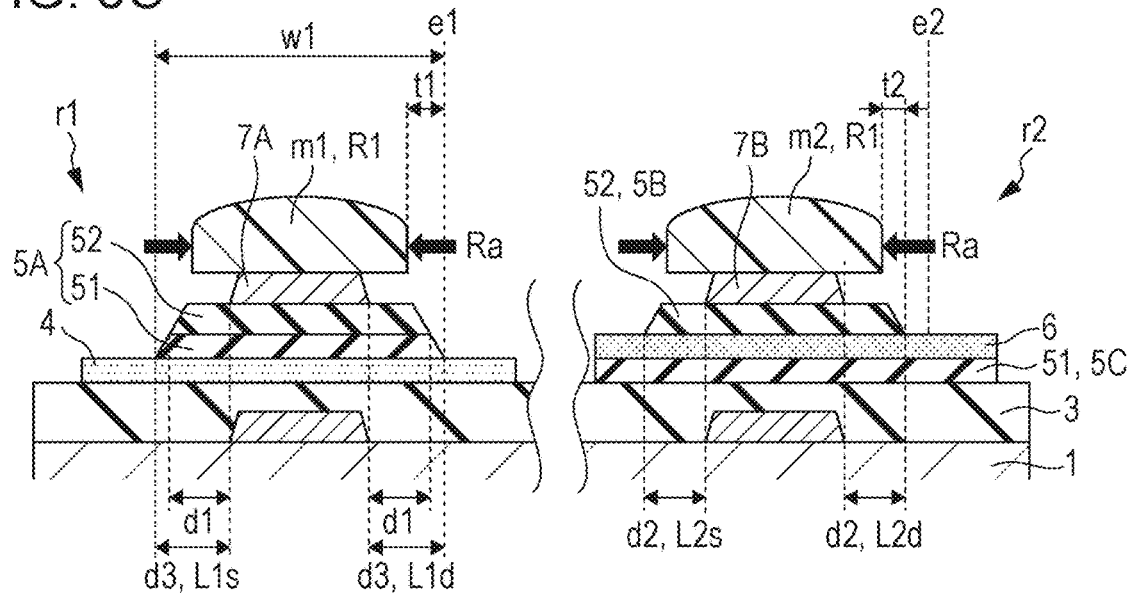
FIG. 5C is a step cross-sectional view showing the first method for manufacturing the active matrix substrate.

The method for patterning the insulating films 510 and 520 is specifically described here with reference to FIGS. 5A to 5C. In this example, the gate insulating layers 5A and 5B are formed by etching the insulating film 520 and the insulating film 510 by utilizing the same first resist layer R1 as that used for the etching of the gate conducting film 70. This makes it possible to reduce the number of manufacturing steps and manufacturing cost.

FIG. 5A shows a state following the patterning of the gate conducting film 70 and preceding the patterning of the insulating films 510 and 520. As illustrated, the mask portions m1 and m2 have widths w1 and w2 in the channel length direction. The widths w1 and w2 of the mask portions m1 and m2 are greater than the widths of the gate electrodes 7A and 7B, respectively. That is, the mask portions m1 and m2 have their edges e1 and e2 located further outward than edges of the gate electrodes 7A and 7B when viewed from an angle parallel with the direction normal to the substrate 1, respectively.

Next, the insulating films 510 and 520 are subjected to dry etching with the first resist layer R1. Conditions for dry etching are set such that the edges of the mask portions m1 and m2 of the first resist layer R1 recede as the film to be etched become further etched. For example, an etching gas containing carbon tetrafluoride ($CF_4$) may be used. This causes taper shapes to be formed on side walls (side surfaces) of the film to be etched. Further, in the present etching, the first oxide semiconductor layer 4 and the second oxide semiconductor layer 6 function as etch stopper layers.

FIGS. 5B and 5C are diagrams showing the present etching step. FIG. 5B shows a point in time at which the etching of the insulating film 520 has finished, and FIG. 5C shows a point in time (just-etched point in time) at which the etching of the insulating film 51 has finished.

As shown in FIG. 5B, in the first TFT formation region r1 and the second TFT formation region r2, the insulating film 520, which is the film to be etched, becomes further etched, so that portions of the insulating film 520 not covered with the mask portion m1 or m2 are removed. In the second TFT formation region r2, the removal of the insulating film 520 causes a part of an upper surface of the second oxide semiconductor layer 6 to become exposed. Further, as the etching proceeds, the mask portions m1 and m2 of the first resist layer R1 too are etched. As a result, the edges of the mask portions m1 and m2 recede in directions of arrows Ra from the places in which the edges e1 and e2 were located before the start of the present etching step. This causes taper shapes to be formed on side walls of the insulating film 520 thus patterned.

As shown in FIG. 5C, as the etching further proceeds, portions of the insulating film 510 exposed by the removal of the insulating film 520 are removed. Further, as the etching proceeds, the edges of the mask portions m1 and m2 further recede in the directions of the arrows Ra. As a result, in the first TFT formation region r1, portions of the insulating film 510 not covered with the mask portion m1 are removed, so that parts of the first oxide semiconductor layer 4 become exposed. As the edge of the mask portion m1 recedes, the side walls of the insulating film 510 thus patterned have taper shapes. Meanwhile, in the second TFT formation region r2, portions of the insulating film 510 not covered with the second oxide semiconductor layer 6 are etched. Further, in each of the TFT formation regions r1 and r2, portions of the insulating film 520 exposed by the recession of the edges of the mask portions m1 and m2 are further etched, so that the insulating film 520 becomes smaller in width.

In this way, the first insulating film 51 is obtained from the insulating film 510, and the second insulating film 52 is obtained from the insulating film 520. In the first TFT formation region r1, the gate insulating layer 5A, which includes the first insulating film 51 and the second insulating film 52, is formed. Side surfaces of the first insulating film 51 and side surfaces of the second insulating film 52 in the gate insulating layer 5A have taper shapes. The first and second insulating films 51 and 52 may have their side surfaces aligned with each other to form side surfaces of the gate insulating layer 5A.

Meanwhile, in the second TFT formation region r2, the gate insulating layer 5B, which includes the second insulating film 52, is formed. The gate insulating layer 5B (here, the second insulating film 52) has taper shapes. Further, the first insulating layer 5C, which includes the first insulating film 51, is formed on the side of the second oxide semiconductor layer 6 that faces the substrate 1. Since the first insulating layer 5C is patterned with the second oxide semiconductor layer 6 as an etching mask, the first insulating layer 5C may have its side surfaces aligned with the side surfaces of the second oxide semiconductor layer 6.

The thickness of the insulating films to serve as the gate insulating layer 5A (here, a total thickness of the first insulating film 51 and the second insulating film 52) is greater than the thickness of the insulating film to serve as the gate insulating layer 5B (here, the thickness of the second insulating film 52). For this reason, the length (hereinafter referred to as "taper length") t1 in the channel length direction of a portion of the gate insulating layer 5A having a taper shape is greater than a taper length t2 of the gate insulating layer 5B (t1>t2). Accordingly, the lengths L1$s$ and L1$d$ of the offset regions of the first TFT 100 are greater than the lengths L2$s$ and Ltd of the offset regions of the second TFT 200 by the difference in taper length Δt (=t1−t2). As a result, the length L1 of the first offset regions 42 can be made greater than the length L2 of the second offset regions 62.

At varies depending on the thicknesses and taper angles of the insulating films 510 and 520. The taper angles may be controlled, for example, by etching conditions or other conditions. The taper angles of the gate insulating layers 5A and 5B are not limited to particular angles but may for example be greater than or equal to 10 degrees and less than 75 degrees.

In this example, the gate conducting film 70 and the insulating film 520 in the first TFT formation region r1 are etched with the same mask and under the same conditions as the gate conducting film 70 and the insulating film 520 in the second TFT formation region r2. For this reason, when viewed from an angle parallel with the direction normal to the substrate 1, an amount of protrusion from the gate electrode 7A of the second insulating film 52 serving as the upper layer of the gate insulating layer 5A (i.e. a distance between an edge of the second insulating film 52 and an edge of the gate electrode 7A) d1 and an amount of protrusion of the second insulating film 52 serving as the gate insulating layer 5B (i.e. a distance between an edge of the second insulating film 52 and an edge of the gate electrode 7B) d2 may be substantially equal to each other. An amount of protrusion d3 of the first insulating film 51 in the gate insulating layer 5A is larger than the amounts of protrusion d1 and d2. The amount of protrusion d3 serves as each of the lengths L1$s$ and L1$d$ of the offset regions of the first TFT 100. The amount of protrusion d2 serves as each of the lengths L2$s$ and Ltd of the offset regions of the second TFT 200.

At the just-etched point in time shown in FIG. 5C, the width of the gate insulating layer 5A in the channel length direction is about equal to the width w1 of the mask portion m1 before the start of the present etching; however, once overetching is done, the width of the gate insulating layer 5A becomes smaller than the width w1 of the mask portion m1.

Although the foregoing has described an example in which the insulating films 510 and 520 are etched by utilizing the first resist layer R1 used for the patterning of the gate conducting film 70, the insulating films 510 and 520 may be subjected to etching by using a resist film that is different from the first resist layer R1. For example, after the etching of the gate conducting film 70, the first resist layer R1 may be removed and a different resist layer may be provided over the insulating film 520 and the gate electrodes 7A and 7B. The different resist layer includes a first mask portion having a greater width than the gate electrode 7A and wholly covering the gate electrode 7A and a second mask portion having a greater width than the gate electrode 7B and wholly covering the gate electrode 7B. As a result, offset regions having a desired width (length in the channel length direction) can be formed adjacent to the channel region in each TFT. The different resist layer may be formed by utilizing the same photomask (gate-metal photomask) as the first resist layer R1. For example, by adjusting the amount of light to which the different resist film is exposed when the resist film is formed, the line width of the different resist layer may be made greater than a width defined by the gate-metal photomask.

Figure 4J:
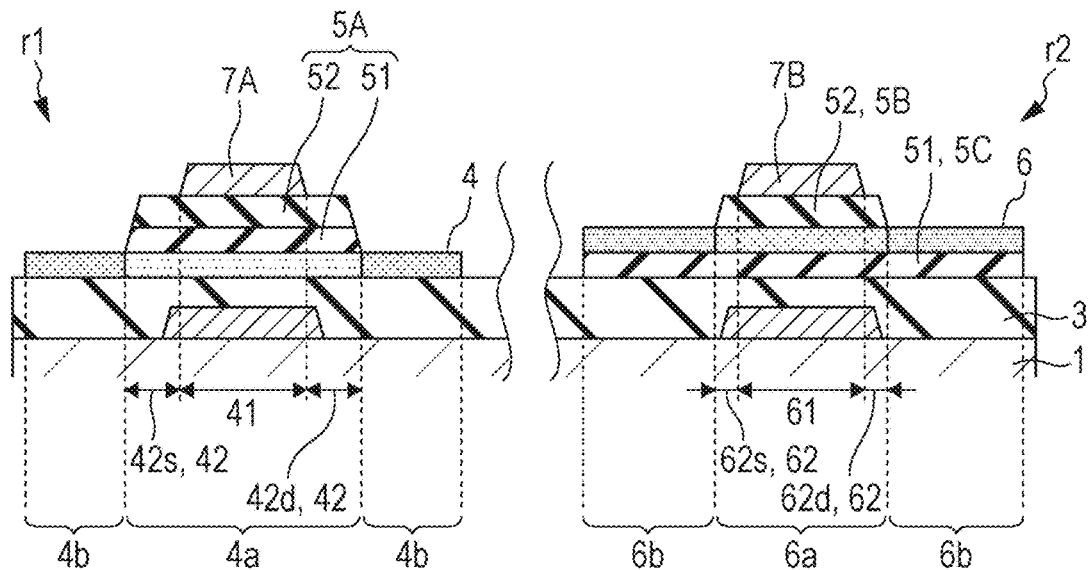
FIG. 4J is a step cross-sectional view showing the first method for manufacturing the active matrix substrate.

Step 10: Process for Lowering Resistances of First and Second Oxide Semiconductor Layers 4 and 6 (FIG. 4J)

Then, a process for lowering the resistances of the first oxide semiconductor layer 4 and the second oxide semiconductor layer 6. As the resistance lowering process, a plasma process may be performed, for example. In the plasma process, exposed regions of the first and second oxide semiconductor layers 4 and 6 exposed from the gate insulating layers 5A and 5B may be exposed to a reducing plasma or a plasma containing doping elements (e.g. an argon plasma). As a result, the exposed regions of the first and second oxide semiconductor layers 4 and 6 as viewed from an angle parallel with the direction normal to the substrate 1 become lower in resistance to serve as the first low-resistance regions 4$b$ and the second low-resistance regions 6$b$, respectively. The first low-resistance regions 4$b$ may each be a conductor region (whose sheet resistance is for example lower than or equal to 200Ω/□). Meanwhile, a region of the first oxide semiconductor layer 4 covered with the gate insulating layer 5A serves as the first high-resistance region (semiconductor region) 4$a$, which is higher in specific resistance than the first low-resistance regions 4$b$. Similarly, a region of the second oxide semiconductor layer 6 covered with the gate insulating layer 5B serves as the second high-resistance region (semiconductor region) 6$a$, which is higher in specific resistance than the second low-resistance regions 6$b$.

The resistance lowering process (plasma process) is not limited to that described above. Methods and conditions for plasma processing are described, for example, in Japanese Unexamined Patent Application Publication No. 2008-

40343. The entire contents of Japanese Unexamined Patent Application Publication No. 2008-40343 are hereby incorporated by reference.

The resistance lowering process is not limited to the plasma process. For example, in a case where the interlayer insulating layer 10 includes an insulating layer (e.g. a SiNx layer) having the property of reducing an oxide semiconductor, the exposed regions of the first and second oxide semiconductor layers 4 and 6 may be made lower in resistance by bringing the interlayer insulating layer 10 into contact with these exposed regions.

Figure 4K:
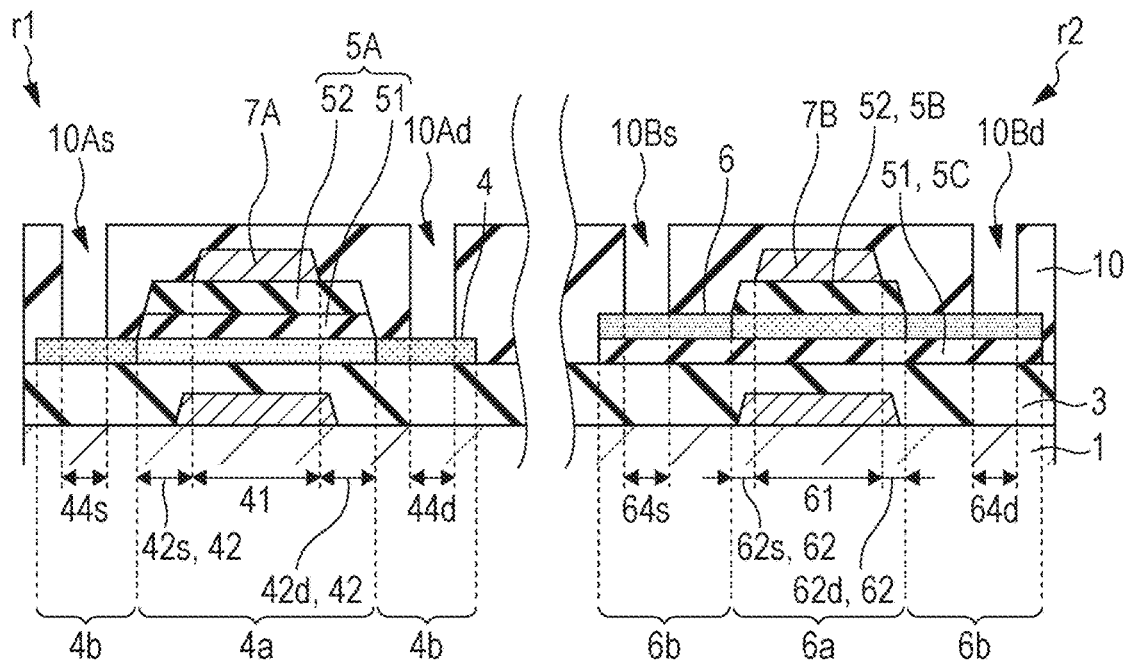
FIG. 4K is a step cross-sectional view showing the first method for manufacturing the active matrix substrate.

Step 11: Formation of Interlayer Insulating Layer 10 (FIG. 4K)

Next, the interlayer insulating layer 10, which covers the first oxide semiconductor layer 4, the second oxide semiconductor layer 6, the gate insulating layers 5A and 5B, and the gate electrodes 7A and 7B, is formed. After this, the interlayer insulating layer 10 is patterned by a publicly-known photolithography step. As a result, as shown in FIG. 4K, the first openings 10As and 10Bs and the second openings 10Ad and 10Bd are formed in the interlayer insulating layer 10. The first opening 10As exposes a portion (source contact region 44s) of the first low-resistance regions 4b of the first oxide semiconductor layer 4 located on the source side of the first channel region 41, and the second opening 10Ad exposes a portion (drain contact region 44d) of the first low-resistance regions 4b of the first oxide semiconductor layer 4 located on the drain side of the first channel region 41. Similarly, the first opening 10Bs exposes a portion (source contact region 64s) of the second low-resistance regions 6b of the second oxide semiconductor layer 6 located on the source side of the second channel region 61, and the second opening 10Bd exposes a portion (drain contact region 64d) of the second low-resistance regions 6b of the second oxide semiconductor layer 6 located on the drain side of the second channel region 61.

As the interlayer insulating layer 10, a single inorganic insulating layer or a stack of inorganic insulating layers can be formed. Examples of such inorganic insulating layers include silicon oxide films, silicon nitride films, silicon oxynitride films, and silicon nitroxide films. The thickness of such an inorganic insulating layer may be greater than or equal to 100 nm and smaller than or equal to 500 mm. It is preferable that the interlayer insulating layer 10 be formed using an insulating film such as a silicon nitride film that reduces an oxide semiconductor, as doing so keeps down the specific resistances of regions (here, the first low-resistance regions 4b and the second low-resistance regions 6b) of the first and second oxide semiconductor layers 4 and 6 that are in contact with the interlayer insulating layer 10. The interlayer insulating layer 10 formed here is for example a SiNx layer (300 nm thick) formed by CVD.

In a case where the interlayer insulating layer 10 used is an insulating layer (e.g. a hydrogen-donating layer such as a silicon nitride layer) that may reduce an oxide semiconductor, the portions of the first and second oxide semiconductor layers 4 and 6 that are in contact with the interlayer insulating layer 10 can be made lower in resistance than portions of the first and second oxide semiconductor layers 4 and 6 that are not in contact with the interlayer insulating layer 10, even without the aforementioned resistance lowering process being performed.

Figure 4L:
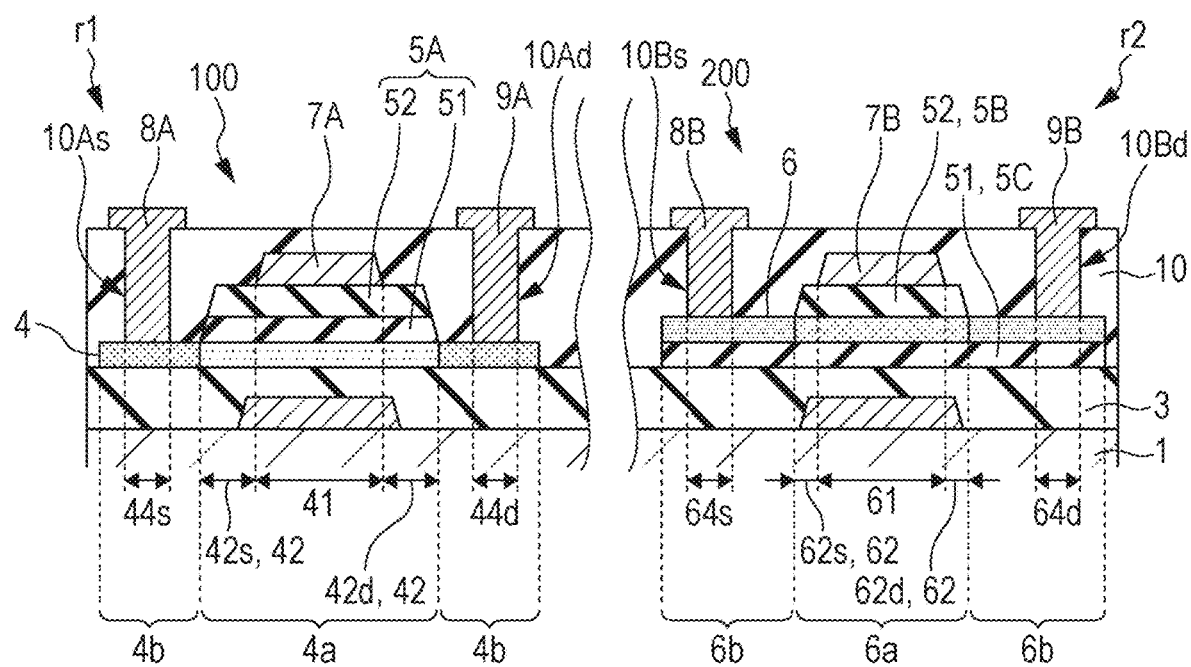
FIG. 4L is a step cross-sectional view showing the first method for manufacturing the active matrix substrate.

Step 12: Formation of Source Electrodes 8A and 8B and Drain Electrodes 9A and 9B (FIG. 4L)

Next, a source conducting film (whose thickness is for example greater than or equal to 50 nm and smaller than or equal to 500 nm) (not illustrated) is formed over the interlayer insulating layer 10, and the source conducting film is patterned. As a result, as shown in FIG. 4L, the source electrodes 8A and 8B and the drain electrodes 9A and 9B are formed. Although not illustrated, source bus lines too are formed from the source conducting film.

In the first TFT formation region r1, the source electrode 8A and the drain electrode 9A are disposed over the interlayer insulating layer 10 and in the openings 10As and 10Ad, and are connected to the source and drain contact regions 44s and 44d of the first oxide semiconductor layer 4 in the openings 10As and 10Ad, respectively. Similarly, in the second TFT formation region r2, the source electrode 8B and the drain electrode 9B are disposed over the interlayer insulating layer 10 and in the openings 10Bs and 10Bd, and are connected to the source and drain contact regions 64s and 64d of the second oxide semiconductor layer 6 in the openings 10Bs and 10Bd, respectively. In this way, the first TFT 100, which is to serve as a pixel transistor, is formed in the first TFT formation region r1, and the second TFT 200, which is to serve as a circuit transistor, is formed in the second TFT formation region r1.

Usable examples of the source conducting film include an element selected from among aluminum (Al), chromium (Cr), copper (Cu), tantalum (Ta), titanium (Ti), molybdenum (Mo), and tungsten (W) and an alloy composed thereof. For example, the source conducting film may have a three-layer structure of titanium film-aluminum film-titanium film, a three-layer structure of molybdenum film-aluminum film-molybdenum film, or other three-layer structures. The source conducting film is not limited to a three-layer structure but may have a single-layer structure, a two-layer structure, or a four-or-more-layer structure. The source conducting film used here is a laminated film whose lower layer is a Ti film (15 to 70 nm thick) and whose upper layer is a Cu film (50 to 400 nm thick). Using a laminated film whose lowermost layer is an ohmic conducting film such as a Ti film makes it possible to more effectively reduce contact resistance with the first oxide semiconductor layer 4 and the second oxide semiconductor layer 6.

Step 13: Formation of Inorganic Insulating Layer 11 and Organic Insulating Layer 12 (FIG. 4M)

Figure 4M:
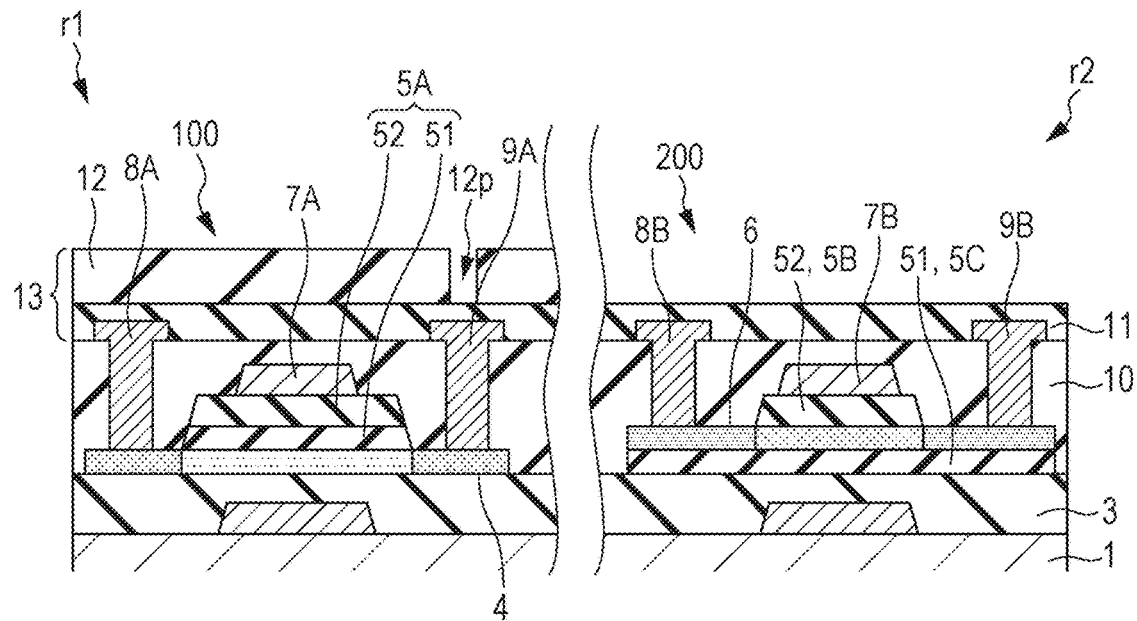
FIG. 4M is a step cross-sectional view showing the first method for manufacturing the active matrix substrate.

Next, as shown in FIG. 4M, an upper insulating layer 13 is formed to cover the interlayer insulating layer 10 and the TFTs 100 and 200. Here, an inorganic insulating layer 11 (whose thickness is for example greater than or equal to 100 nm and smaller than or equal to 500 nm) and an organic insulating film 12 (whose thickness is for example 1 to 4 μm, preferably 2 to 3 μm) are formed in this order as the upper insulating layer 13.

As the inorganic insulating layer 11, an inorganic insulating film similar to the interlayer insulating layer 10 can be used. The inorganic insulating layer 11 formed here is for example a SiNx layer (300 nm thick) formed by CVD. The organic insulating layer 12 may for example be an organic insulating film (e.g. an acrylic resin film) containing a photosensitive resin material.

After this, the organic insulating layer 12 is patterned. As a result, in each pixel area, an opening 12p through which a part of the inorganic insulating layer 11 is exposed is formed in the organic insulating layer 12. The opening 12p is disposed to overlap the drain electrode 9A of the TFT 100 when viewed from an angle parallel with the direction normal to the substrate 1. This patterning may include wholly removing a portion of the organic insulating layer 12 located in the non-display area.

Step 14: Formation of Common Electrode CE (FIG. 4N)

Figure 4N:
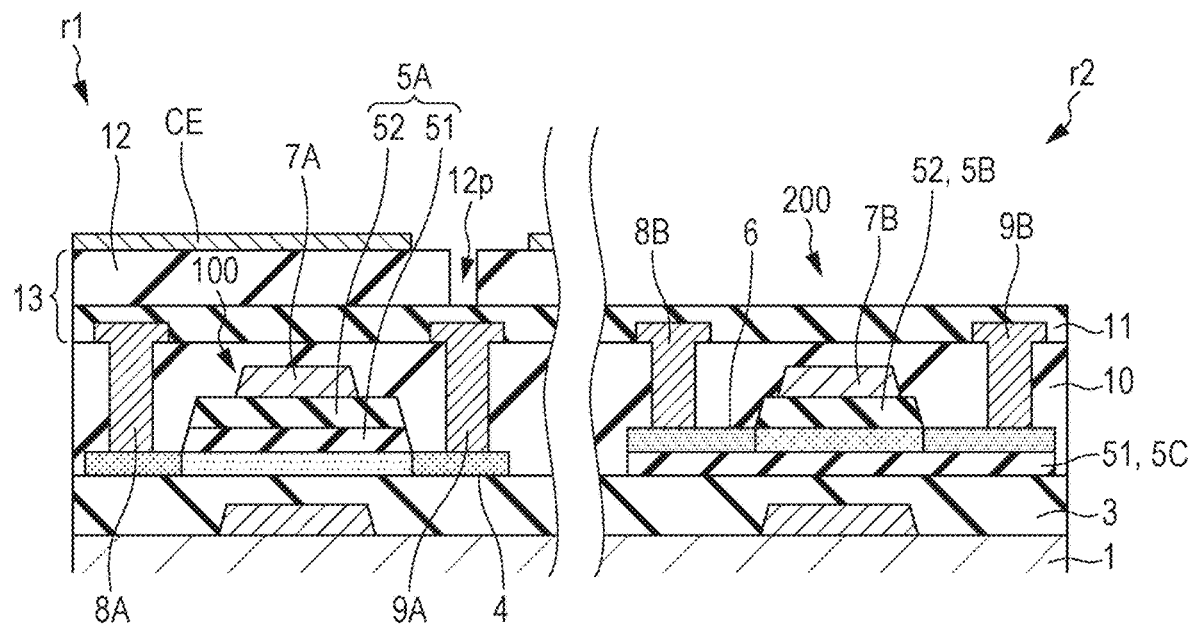
FIG. 4N is a step cross-sectional view showing the first method for manufacturing the active matrix substrate.

Then, as shown in FIG. 4N, the common electrode CE is formed over the upper insulating layer 13.

First, a first transparent conducting film (20 to 300 nm thick) (not illustrated) is formed over the upper insulating layer 13 and in the opening 12p. The first transparent conducting film formed here is for example an indium-zinc oxide film formed by sputtering. The first transparent conducting film can be made of a metal oxide such as an indium-tin oxide (ITO), an indium-zinc oxide, or ZnO. After this, the first transparent conducting film is patterned. In this patterning, for example, wet etching may be performed with an oxalic etching solution. As a result, the common electrode CE is obtained. The common electrode CE may have an opening over a region in which a pixel contact hole is formed.

Step 15: Formation of Dielectric Layer 17 (FIG. 4O)

Figure 4O:
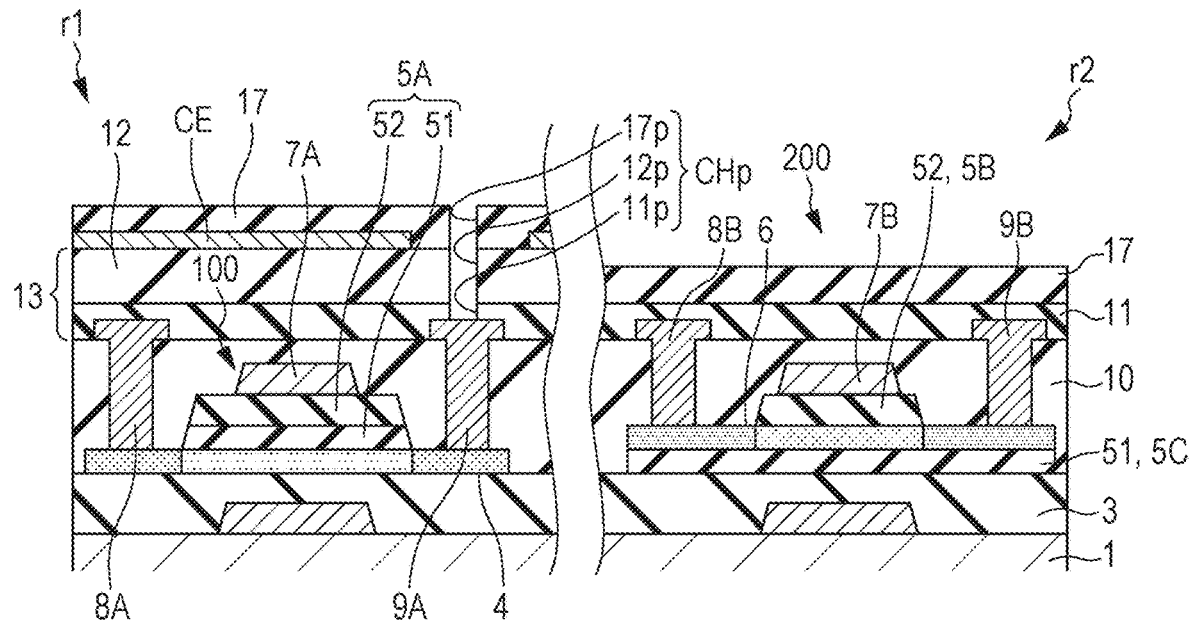
FIG. 4O is a step cross-sectional view showing the first method for manufacturing the active matrix substrate.

Next, as shown in FIG. 4O, a dielectric layer (50 to 500 nm thick) 17 is formed to cover the common electrode CE, and the dielectric layer 17 and the inorganic insulating layer 11 are patterned.

In the pixel area, the dielectric layer 17 is formed over the organic insulating layer 12 and the common electrode CE and in the opening 12p. The dielectric layer 17 may be made of a material taken as an example of a material of which the inorganic insulating layer 11 is made. The dielectric layer 17 formed here is for example a SiN film formed by CVD.

After this, the dielectric layer 17 and the inorganic insulating layer 11 are etched by a publicly-known photolithography step, whereby a pixel contact hole CHp through which the drain electrode 9A of the TFT 100 is exposed is formed. In this example, the pixel contact hole CHp is constituted by an opening 17p of the dielectric layer 17, the opening 12p of the organic insulating layer 12, and an opening 11p of the inorganic insulating layer 11. The opening 17p needs only at least partially overlap the opening 12p when viewed from an angle parallel with the direction normal to the substrate 1. The opening 11p is etched with a resist layer (not illustrated) over the dielectric layer 17 and the organic insulating layer 12 as masks.

Figure 4P:
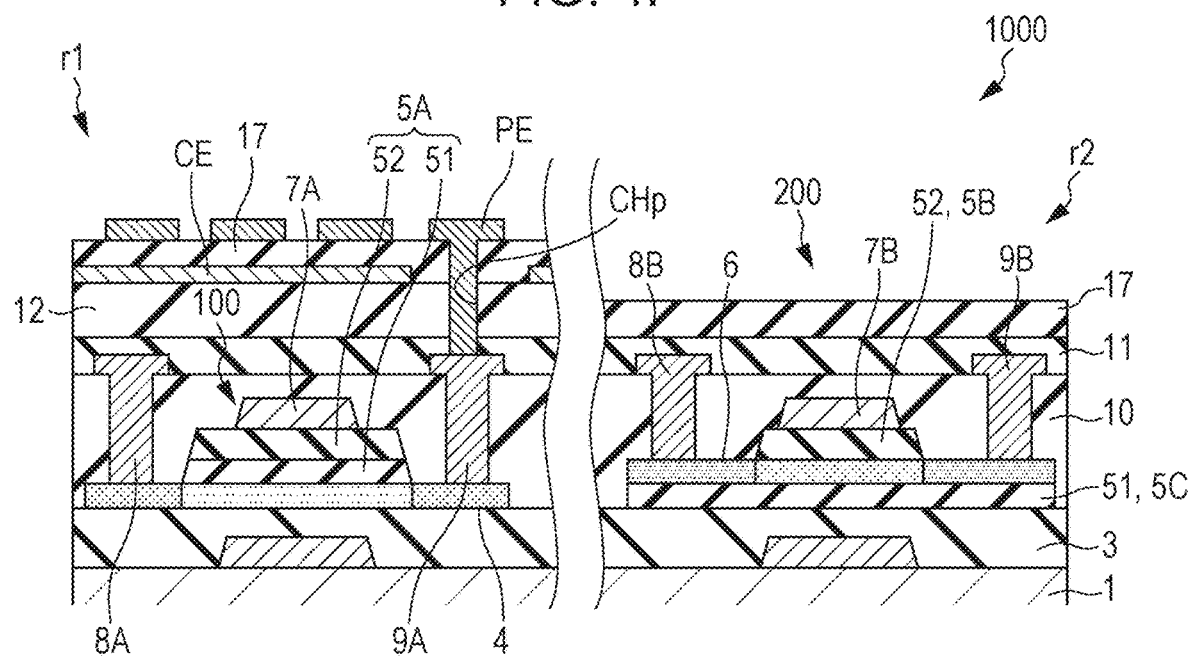
FIG. 4P is a step cross-sectional view showing the first method for manufacturing the active matrix substrate.

Step 16: Formation of Pixel Electrode PE (FIG. 4P)

Next, a second transparent conducting film (20 to 300 nm thick) (not illustrated) is formed over the dielectric layer 17 and in the pixel contact hole CHp. The second transparent conducting film may be made of a material similar to the material of which the first transparent conducting film is made.

After this, the second transparent conducting film is patterned. Here, for example, the second transparent conducting film is subjected to wet etching with an oxalic etching solution. As a result, as shown in FIG. 4P, a pixel electrode PE is formed in each pixel area. The pixel electrode PE is connected to the drain electrode 9A of the TFT 100 in the pixel contact hole CHp. In this way, the active matrix substrate 1000 is manufactured.

The structure of the active matrix substrate 1000 is not limited to the illustrated structure. The pixel electrode PE and the common electrode CE need only be disposed to face each other across the dielectric layer 17. Although the foregoing has shown an example in which the common electrode CE is disposed over the pixel electrode PE with the dielectric layer 17 sandwiched therebetween, the common electrode CE may be disposed on the side of the pixel electrode PE that faces the substrate 1.

Further, the source electrode of the pixel TFT and the source bus lines (not illustrated) may be formed at the same level as the lower conductive layers 2A and 2B (i.e. using the same conducting film as the lower conductive layers 2A and 2B). Furthermore, the pixel electrode PE may be directly connected to the oxide semiconductor layer (drain contact region) of the pixel TFT. In such a case, a portion of the pixel electrode PE that is in contact with the oxide semiconductor layer of the pixel TFT may be referred to as "drain electrode".

The method for manufacturing an active matrix substrate 1000 is not limited to the aforementioned method. For example, the method for patterning the insulating film 510 and the insulating film 520 in STEP 9 is not limited to the method described with reference to FIG. 5A to 5C. In the following, a modification of the method for patterning the insulating film 510 and the insulating film 520 is described with reference to the drawings.

Modification 1

In Modification 1, the insulating film 510 and the insulating film 520 are patterned using different resist masks.

FIGS. 6A to 6D are step cross-sectional views explaining a modification of the method for patterning the insulating film 510 and the insulating film 520. The materials of which the layers are made, the thicknesses of the layers, the processes for forming the layers, or other features are not described if such features are similar to those of the method described with reference to FIGS. 4A to 4P and FIGS. 5A to 5C.

Figure 6A:
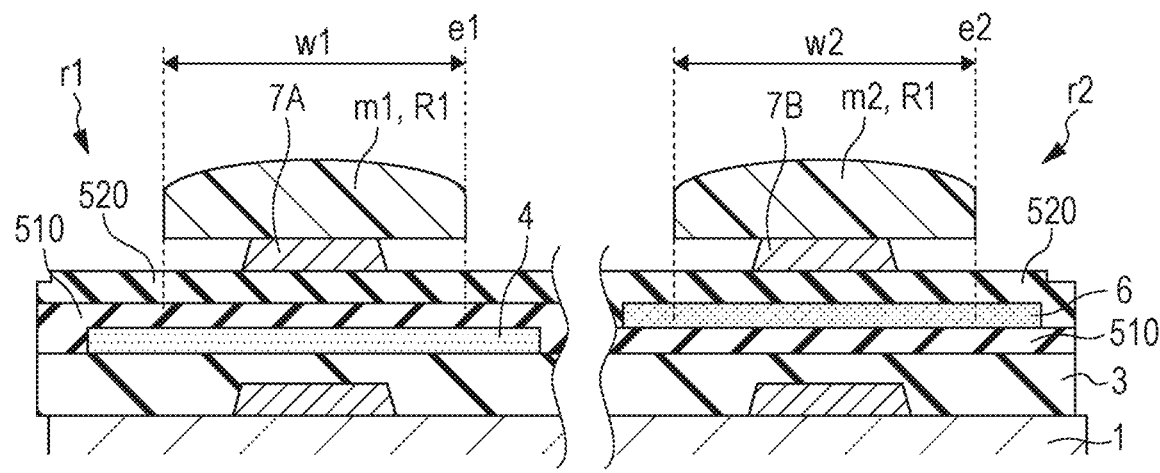
FIG. 6A is a step cross-sectional view showing a second method for manufacturing the active matrix substrate.

First, a method similar to the method described with reference to FIGS. 4A to 4H is executed up to the step (STEP 8) of forming the gate electrodes 7A and 7B. In STEP 8, the gate electrodes 7A and 7B are formed by patterning the gate conducting film 70 using the first resist layer R1. FIG. 6A shows a state following the formation of the gate electrodes 7A and 7B and preceding the patterning of the insulating films 510 and 520.

Figure 6B:
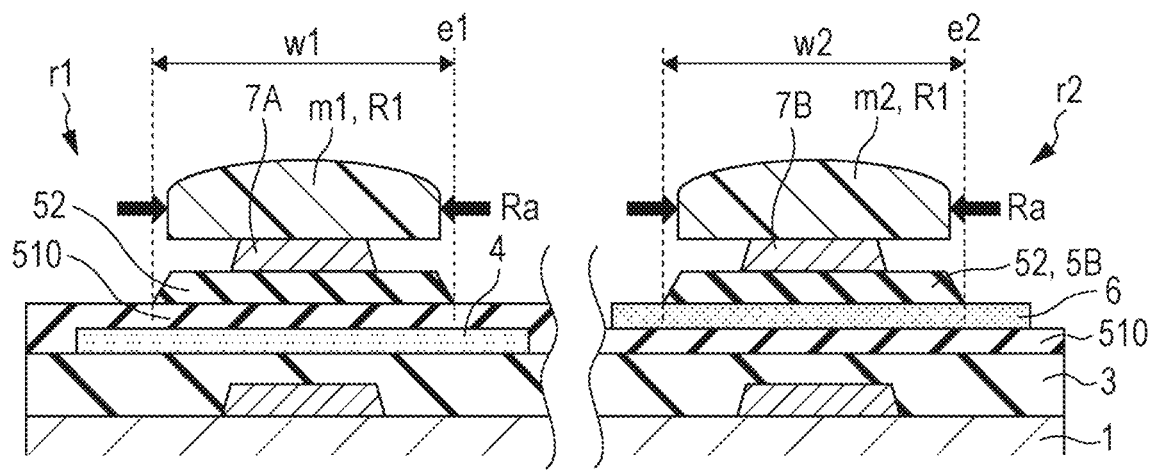
FIG. 6B is a step cross-sectional view showing the second method for manufacturing the active matrix substrate.

Next, as shown in FIG. 6B, the second insulating film 52 is obtained by subjecting the insulating film 520 to dry etching (called "first etching") by utilizing the first resist layer R1 used for the etching of the gate conducting film 70. FIG. 6B shows a point in time (just-etched point in time) at which the etching of the insulating film 520 has finished. Conditions for the first etching may be the same as the conditions described above with reference to FIGS. 5B and 5C, except that the etching time is shorter.

As a result of the first etching, a portion of the second insulating film 52 that is to serve as the upper layer of the gate insulating layer of the first TFT is formed in the first TFT formation region r1, and a portion of the second insulating film 52 that is to serve as the gate insulating layer 5B of the second TFT is formed in the second TFT formation region r2. After this, the first resist layer R1 is removed.

At the just-etched point in time shown in FIG. 6B, the width of the second insulating film 52 is about equal to the widths w1 and w2 of the mask portions m1 and m2 before the start of the first etching; however, once overetching is done, the width of the second insulating film 52 becomes smaller than the widths w1 and w2 of the mask portions m1 and m2.

Figure 6C:
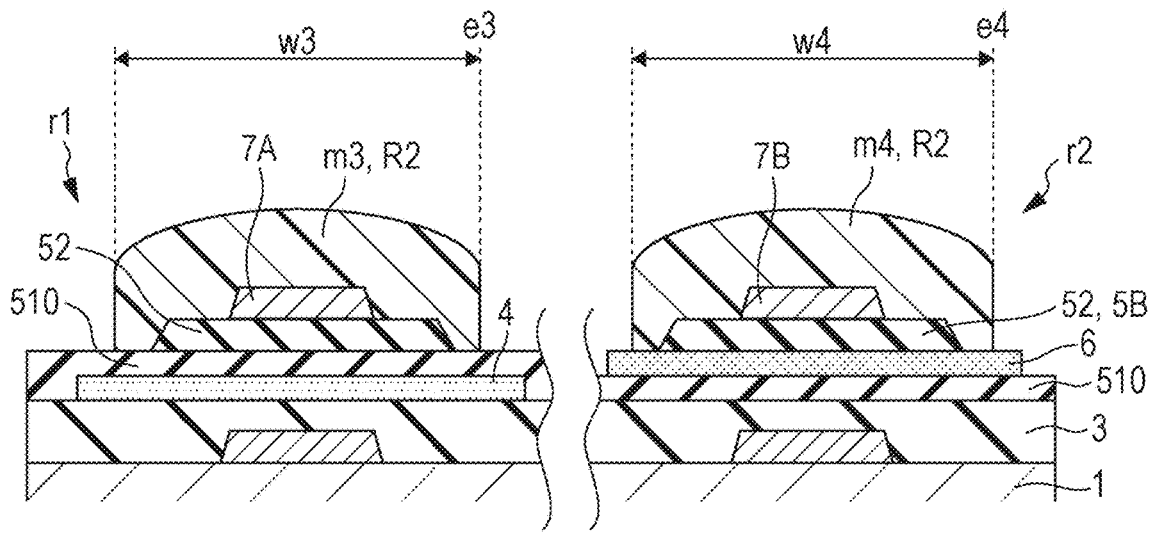
FIG. 6C is a step cross-sectional view showing the second method for manufacturing the active matrix substrate.

Then, as shown in FIG. 6C, a second resist layer R2 is formed over the insulating film 520, the gate insulating layer 5B, and the gate electrodes 7A and 7B. The second resist layer R2 includes a mask portion m3 and a mask portion m4.

The mask portion m3 wholly covers the gate insulating layer 5A and the gate electrode 7A in the first TFT formation region r1. In this example, a width w3 of the mask portion m3 in the channel length direction is greater than the width of the portion of the second insulating film 52 that is to serve as the upper layer of the gate insulating layer 5A and smaller than the width of the first oxide semiconductor layer 4. That is, the mask portion m3 has its edge e3 located further outward than a side surface of the second insulating film 52 and further inward than a side surface of the first oxide semiconductor layer 4 when viewed from an angle parallel with the direction normal to the substrate 1. The width w3 of the mask portion m3 may be set to be sufficiently larger than that of the second insulating film 52 so that the second insulating film 52 is not etched even when the edge e3 of the mask portion m3 recedes in the after-mentioned second etching.

The mask portion m4 wholly covers the gate insulating layer 5B and the gate electrode 7B in the second TFT formation region r2. In this example, a width w4 of the mask portion m4 in the channel length direction is greater than the width of the gate insulating layer 5B and smaller than the width of the second oxide semiconductor layer 6. That is, the mask portion m4 has its edge e4 located further outward than a side surface of the gate insulating layer 5B and further inward than a side surface of the second oxide semiconductor layer 6 when viewed from an angle parallel with the direction normal to the substrate 1. The width w4 of the mask portion m4 may be set to be sufficiently larger than that of the gate insulating layer 5B so that the gate insulating layer 5B (second insulating film 52) is not etched even when the edge e4 of the mask portion m4 recedes in later etching.

The width w4 of the mask portion m4 in the channel length direction may be set to be larger than the width of the second oxide semiconductor layer 6. This makes it possible to inhibit etching of a portion of the insulating film 510 located near an edge of the second oxide semiconductor layer 6 (particularly below the edge).

The second resist layer R2 may be formed by utilizing the same gate metal photomask as the first resist layer R1. Since the line widths of the mask portions m1 and m2 of the first resist layer R1 have been reduced by the first etching, the mask portions m3 and m4 can be formed to be greater in width than the mask portions m1 and m2 after the first etching even by using the same photomask. The line widths of the mask portions m3 and m4 may be further increased by using the same photomask as the first resist layer R1 and adjusting the amount of light to which the photomask is exposed. An increase in manufacturing cost can be kept down by forming the first resist layer R1 and the second resist layer R2 by utilizing the same photomask. The second resist layer R2 used may be a photomask that is different from the first resist layer R1.

Figure 6D:
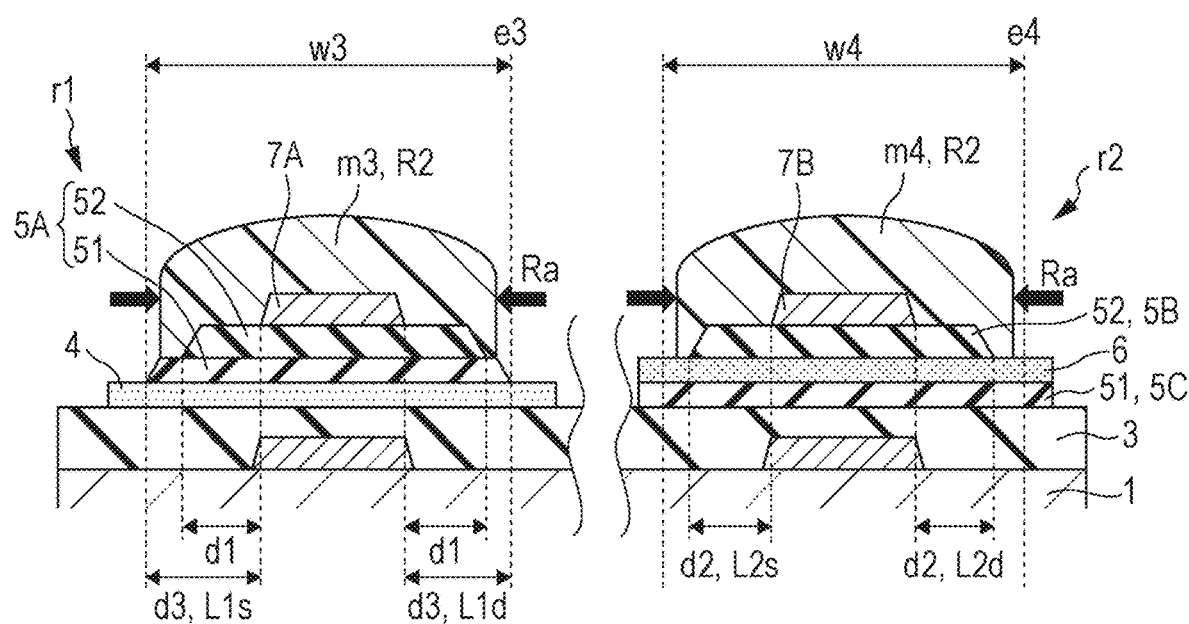
FIG. 6D is a step cross-sectional view showing the second method for manufacturing the active matrix substrate.

Next, as shown in FIG. 6D, the first insulating film 51 is obtained by subjecting the insulating film 510 to dry etching (called "second etching") with the second resist layer R2 as a mask. FIG. 6D shows a point in time (just-etched point in time) at which the etching of the insulating film 510 has finished. Conditions for the second etching may be the same as the conditions described above with reference to FIGS. 5B and 5C, except that the etching time is shorter.

In the second etching, a portion of the insulating film 510 not covered with the mask portion m3 when viewed from an angle parallel with the direction normal to the substrate 1 is removed from the first TFT formation region r1. As a result, in the first TFT formation region r1, the first insulating film 51, which is to serve as the lower layer of the gate insulating layer 5A, is formed from the insulating film 510. The side surfaces of the insulating film 51 may have taper shapes. In the illustrated example, the side surfaces of the second insulating film 52 in the gate insulating layer 5A are located further inward than the side surfaces of the first insulating film 51 when viewed from an angle parallel with the direction normal to the substrate 1. That is, the second insulating film 52 covers only a part of the upper surface of the first insulating film 51, so that steps are formed on the side surfaces of the gate insulating layer 5A. In the gate insulating layer 5A, a portion of the upper surface of the first insulating film 51 located further outward than the side surfaces of the second insulating film 52 (i.e. a portion not covered with the second insulating film 52) may be in direct contact with the interlayer insulating layer 10. At the just-etched point in time shown in FIG. 6D, the width of the first insulating film 51 is about equal to the width w3 of the mask portion m3 before the start of the second etching; however, once overetching is done, the width of the first insulating film 51 becomes smaller than the width w3 of the mask portion m3.

Further, in the second TFT formation region r2, a portion of the insulating film 510 not covered with the second oxide semiconductor layer 6 is removed by the second etching. As a result, the first insulating layer 5C is formed from the insulating film 510. The first insulating layer 5C is located on the side of the second oxide semiconductor layer 6 that faces the substrate 1. The first insulating layer 5C may have its side surfaces aligned with the side surfaces of the second oxide semiconductor layer 6.

In this example, the second insulating film 52 serving as the upper layer of the gate insulating layer 5A is not etched during the second etching, as the second insulating film 52 is covered with the mask portion m3. Similarly, the gate insulating layer 5B is not etched, as the gate insulating layer 5B is covered with the mask portion m4.

Although not illustrated, the subsequent steps are similar to the steps described with reference to FIGS. 4J to 4P.

In the present modification, the width w3 of the mask portion m3 of the second resist layer R2 is set so that the width of the lower layer of the gate insulating layer 5A of the first TFT is greater than the width of the gate insulating layer 5B of the second TFT. This makes it possible to make the length L1 of the first offset regions 42 greater than the length L2 of the second offset regions 62.

Further, in the present modification too, as in the case of the example shown in FIGS. 5A to 5C, the gate conducting film 70 and the insulating film 520 in the first TFT formation region r1 are etched with the same mask and under the same conditions as the gate conducting film 70 and the insulating film 520 in the second TFT formation region r2. For this reason, the amount of protrusion d1 of the second insulating film 52 serving as the upper layer of the gate insulating layer 5A and the amount of protrusion d2 of the second insulating film 52 serving as the gate insulating layer 5B may be substantially equal to each other. The amount of protrusion d3 of the first insulating film 51 in the gate insulating layer 5A is larger than the amounts of protrusion d1 and d2.

According to the present modification, the width of the gate insulating layer 5B of the second TFT 200 and the length L2 of the second offset regions 62 can be controlled by the width w2 of the mask portion m2 of the first resist layer R1 used in the first etching. Further, the width of the gate insulating layer 5A of the first TFT 100 and the length L1 of the first offset regions 42 can be controlled by the width w3 of the mask portion m3 of the second resist layer R2 used in the second etching. Since the length L1 of the first offset regions 42 and the length L2 of the second offset regions 62 can be thus controlled independently of each other, these lengths L1 and L2 can be set with high degrees of freedom. Further, even in a case where the first etching and the second etching are performed under such conditions that taper shapes are hardly formed on the side surfaces of the second and first insulating films 52 and 51, the length L1 of the first offset regions 42 can be made greater than the length L2 of the second offset regions 62.

Modification 2

In Modification 2, the gate insulating layer 5A of the first TFT 100 and the gate insulating layer 5B of the second TFT 200 are patterned using different resist masks.

FIGS. 7A to 7D are step cross-sectional views explaining a further modification of the method for patterning the insulating film 510 and the insulating film 520. The materials of which the layers are made, the thicknesses of the layers, the processes for forming the layers, or other features are not described if such features are similar to those of the method described with reference to FIGS. 4A to 4P and FIGS. 5A to 5C.

The method described above with reference to FIGS. 4A to 4H is executed up to the step (STEP 8) of forming the gate electrodes 7A and 7B. In STEP 8, the gate electrodes 7A and 7B are formed by patterning the gate conducting film 70 using the first resist layer R1. After this, the first resist layer R1 is removed.

Figure 7A:
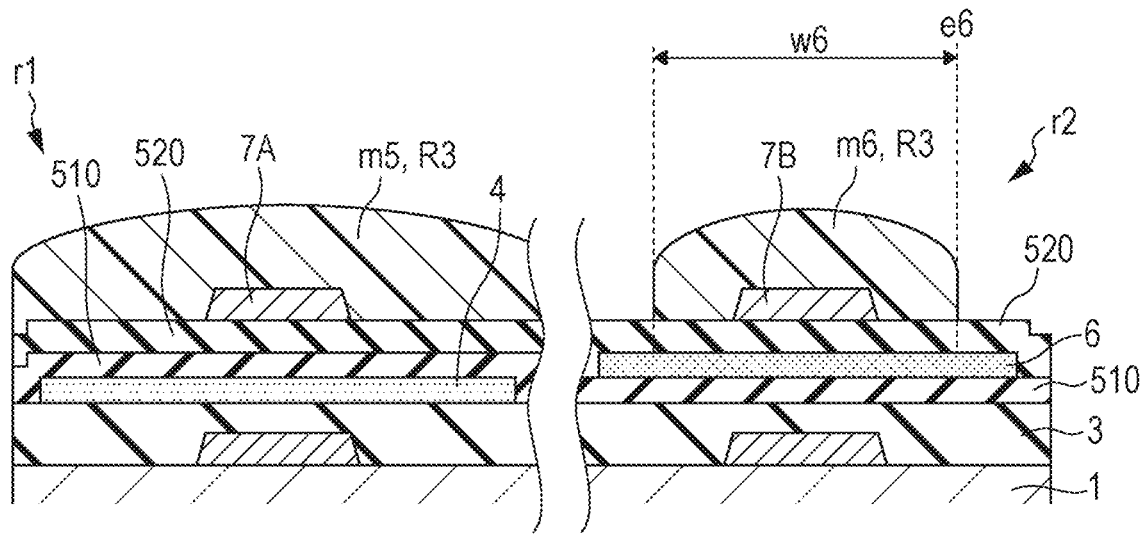
FIG. 7A is a step cross-sectional view showing a third method for manufacturing the active matrix substrate.

Then, as shown in FIG. 7A, a third resist layer R3 is formed over the insulating film 520 and the gate electrodes 7A and 7B. The third resist layer R3 includes a mask portion m5 and a mask portion m6. The mask portion m5 is disposed to cover the first TFT formation region r1. Meanwhile, the mask portion m6 is disposed to partially cover the gate electrode 7B and the insulating film 520 in the second TFT formation region r2. A width w6 of the mask portion m6 is greater than the width of the gate electrode 7B and smaller than the width of the second oxide semiconductor layer 6.

Figure 7B:
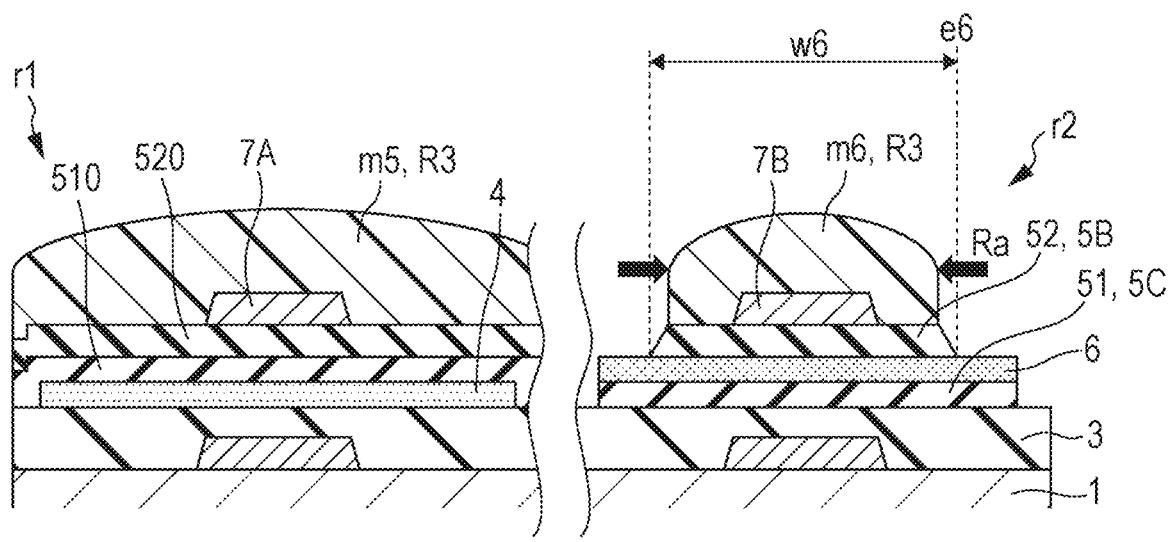
FIG. 7B is a step cross-sectional view showing the third method for manufacturing the active matrix substrate.

Next, as shown in FIG. 7B, the insulating films 520 and 510 are subjected to dry etching (called "third etching") with the third resist layer R3 as a mask. Conditions for the third etching may be the same as the conditions described above with reference to FIGS. 5B and 5C. Although FIG. 7B shows a point in time (just-etched point in time) at which the etching of the insulating films 510 and 520 has finished, overetching may be performed.

As a result of the third etching, a portion of the second insulating film 52 that is to serve as the gate insulating layer 5B is formed from the insulating film 520 in the second TFT formation region r2. The second insulating film 52 may have a taper shape. Further, the first insulating layer 5C is formed from the insulating film 510 on the side of the second oxide semiconductor layer 6 that faces the substrate 1. In the first TFT formation region r1, the insulating film 510 and the insulating film 520 are not etched, as they are covered with the mask portion m5. After this, the third resist layer R3 is removed.

Figure 7C:
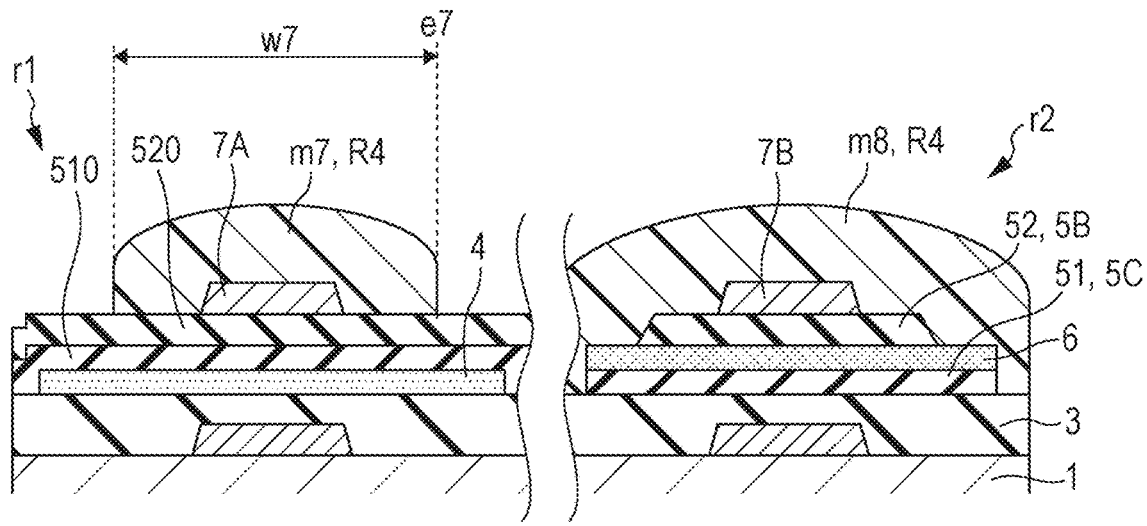
FIG. 7C is a step cross-sectional view showing the third method for manufacturing the active matrix substrate.

Then, as shown in FIG. 7C, a fourth resist layer R4 is formed over the insulating film 520, the gate insulating layer 5B, and the gate electrodes 7A and 7B. The fourth resist layer R4 includes a mask portion m7 and a mask portion m8. In the first TFT formation region r1, the mask portion m7 partially covers the gate electrode 7A and the insulating film 520. A width w7 of the mask portion m7 is smaller than the width of the gate electrode 7A and smaller than the width of the first oxide semiconductor layer 4. Meanwhile, the mask portion m8 is disposed to cover the second TFT formation region r2.

Figure 7D:
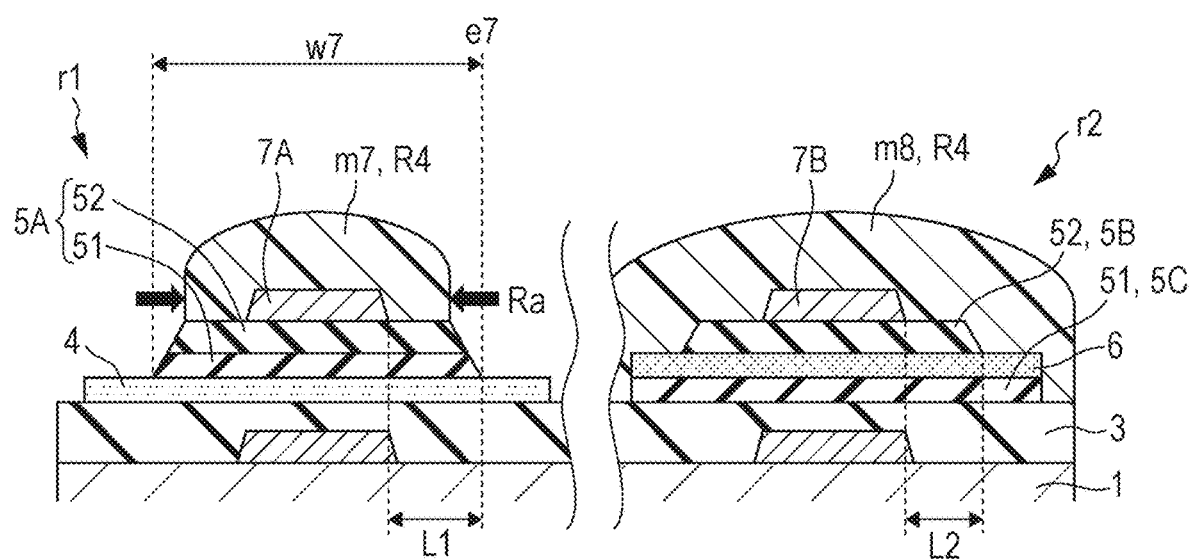
FIG. 7D is a step cross-sectional view showing the third method for manufacturing the active matrix substrate.

Next, as shown in FIG. 7D, the insulating films 520 and 510 are subjected to dry etching (called "fourth etching") with the fourth resist layer R4 as a mask. Conditions for the fourth etching may be the same as the conditions described above with reference to FIGS. 5B and 5C. Although FIG. 7D shows a point in time (just-etched point in time) at which the etching of the insulating films 510 and 520 has finished, overetching may be performed.

As a result of the fourth etching, a portion of the second insulating film 52 that is to serve as the upper layer of the gate insulating layer 5A is formed from the insulating film 520, and the first insulating film 51, which is to serve as the lower layer of the gate insulating layer 5A, is formed from the insulating film 510 in the first TFT formation region r1. The side surfaces of the second and first insulating films 52 and 51 may have taper shapes. In the second TFT formation region r2, the first insulating layer 5C and the gate insulating layer 5B are not etched, as they are covered with the mask portion m8. After this, the fourth resist layer R4 is removed.

Although not illustrated, the subsequent steps are similar to the steps described with reference to FIGS. 4J to 4P.

In the present modification, the width w7 of the mask portion m7 of the fourth resist layer R4 can be set so that the width of the gate insulating layer 5A of the first TFT is greater than the width of the gate insulating layer 5B of the second TFT. This makes it possible to make the length L1 of the first offset regions 42 greater than the length L2 of the second offset regions 62. The fourth etching may precede the third etching.

According to the present modification, the width of the gate insulating layer 5B of the second TFT 200 and the length L2 of the second offset regions 62 are controlled by the width w6 of the mask portion m6 of the third resist layer R3 used in the third etching, and the width of the gate insulating layer 5A of the first TFT 100 and the length L1 of the first offset regions 42 are controlled by the width w7 of the mask portion m7 of the fourth resist layer R4 used in the fourth etching. Since the length L1 of the first offset regions 42 and the length L2 of the second offset regions 62 can be thus controlled independently of each other, these lengths L1 and L2 can be set with high degrees of freedom. Further, even in a case where the third etching and the fourth etching are performed under such conditions that taper shapes are hardly formed on the side surfaces of the gate insulating layers 5A and 5B, the length L1 of the first offset regions 42 can be made greater than the length L2 of the second offset regions 62.

Configuration and Operation of Gate Drive Circuit

A circuit configuration and operation of a gate driver that is monolithically formed in an active matrix substrate are described. The gate driver includes a shift register. The shift register includes a plurality of unit shift register circuits connected in a multistage manner.

Figure 8:
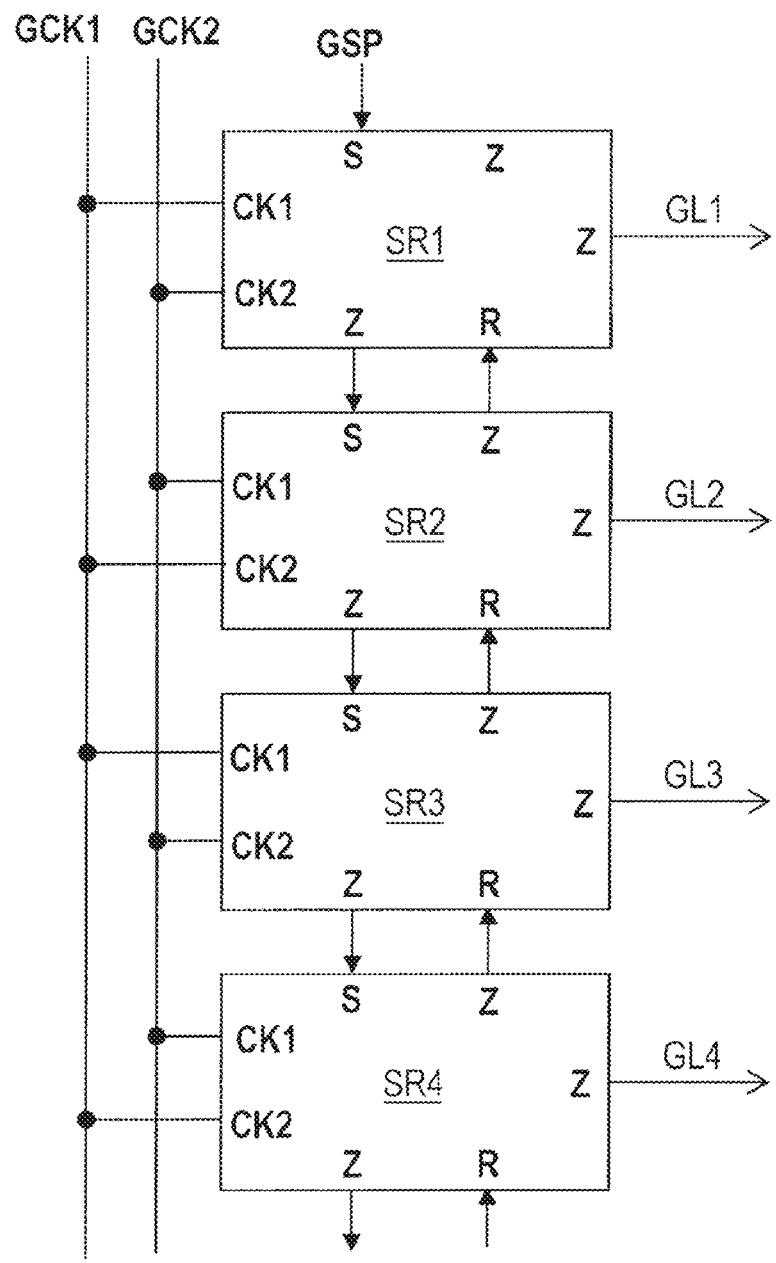
FIG. 8 is a diagram illustrating a shift register circuit in a gate drive circuit.

FIG. 8 is a diagram illustrating a shift register circuit.

The shift register circuit has a plurality of unit shift register circuits SR1 to SRz (where z is an integer greater than or equal to 2) (hereinafter referred to collectively as "unit shift register circuits SR"). Each of the unit shift register circuits SR includes a set terminal S through which to receive a set signal, an output terminal Z through which to output an output signal, a reset terminal R through which to receive a reset signal, and clock input terminals CK1 and CK2 through which to receive clock signals GCK1 and GCK2. A unit shift register circuit SRα (α≥2) receives through its set terminal an output signal from the preceding unit shift register circuit SR. The first unit shift register circuit SR1 receives a gate start pulse signal GSP though its set terminal S. Each of the unit shift register circuits SR outputs an output signal to a corresponding one of the gate bus lines GL disposed in the display area. Each of the unit shift register circuits SR receives through its reset terminal R an output signal from the subsequent unit shift register circuit SR. The final unit shift register circuit SRz receives a clear signal through its reset terminal R.

The two clock input terminals CK1 and CK2 are supplied with the two-phase clock signals GCK1 and GCK2. The clock signal GCK1 is inputted through one of the clock input terminals CK1 and CK2, and the clock signal GCK2 is inputted through the other of the clock input terminals CK1 and CK2. Clock signals that are inputted through clock input terminals are configured to change places with each other between adjacent stages.

Figure 9:
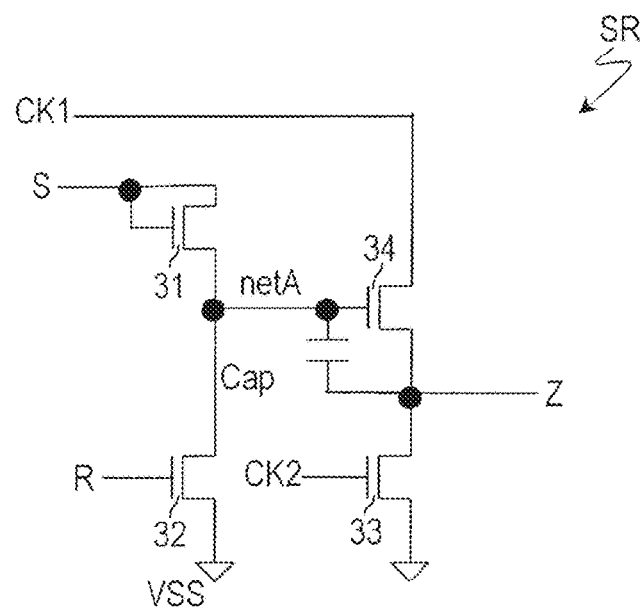
FIG. 9 is a diagram illustrating a unit shift register circuit.

FIG. 9 is a diagram showing an example of a unit shift register circuit SR. In this example, the unit shift register circuit SR includes four TFTs 31 to 34 and a capacitor portion Cap.

The TFT 31 is an input transistor. The TFT 31 has a gate connected to the set terminal S, a drain connected to the set terminal S, and a source connected to a gate of the TFT 34. The TFT 34 is an output transistor. The TFT 34 has a drain connected to the clock input terminal CK1 and a source connected to the output terminal Z. That is, the TFT 34 serves as a transmission gate to pass or intercept a clock signal that is inputted through the clock input terminal CK1.

The capacitor portion Cap is connected between the gate and source of the TFT 34, which is an output transistor. A node connected to the gate of the TFT 34 is herein referred to as "node netA", and a node connected to the output terminal Z is herein referred to as "node Z". The capacitor portion Cap has a first electrode connected to the gate of the TFT 34 and the node netA and a second electrode connected to the source of the TFT 34 and the node Z.

The TFT 32 is disposed between a Low power input terminal and the node netA. The TFT 32 is a pull-down transistor configured to lower the potential of the node netA. The TFT 32 has a gate connected to the reset terminal R, a drain connected to the node netA, and a source connected to the Low power input terminal.

The TFT 33 is connected to the node Z. The TFT 33 has a gate connected to the clock input terminal CK2, a drain connected to the node Z, and a source connected to the Low power input terminal.

In the present embodiment, first TFTs may be used as the TFTs 31 to 34. Alternatively, a second TFT having great current drive force (high mobility) is used as at least the TFT 34, which is an output transistor, and first TFTs may be used as the other TFTs. This allows the drive circuit to have a mixture of two types of TFT of different characteristics depending on its intended use. Further, it is preferable that the TFTs 31 to 34 all have enhancement characteristics regardless of their TFT structures.

The configuration of the drive circuit is not limited to the illustrated configuration. For example, a unit shift register circuit may include five or more TFTs including an output transistor.

Configuration and Operation of SSD Circuit

A circuit configuration and operation of an SSD circuit that is monolithically formed in an active matrix substrate are described.

Figure 10:
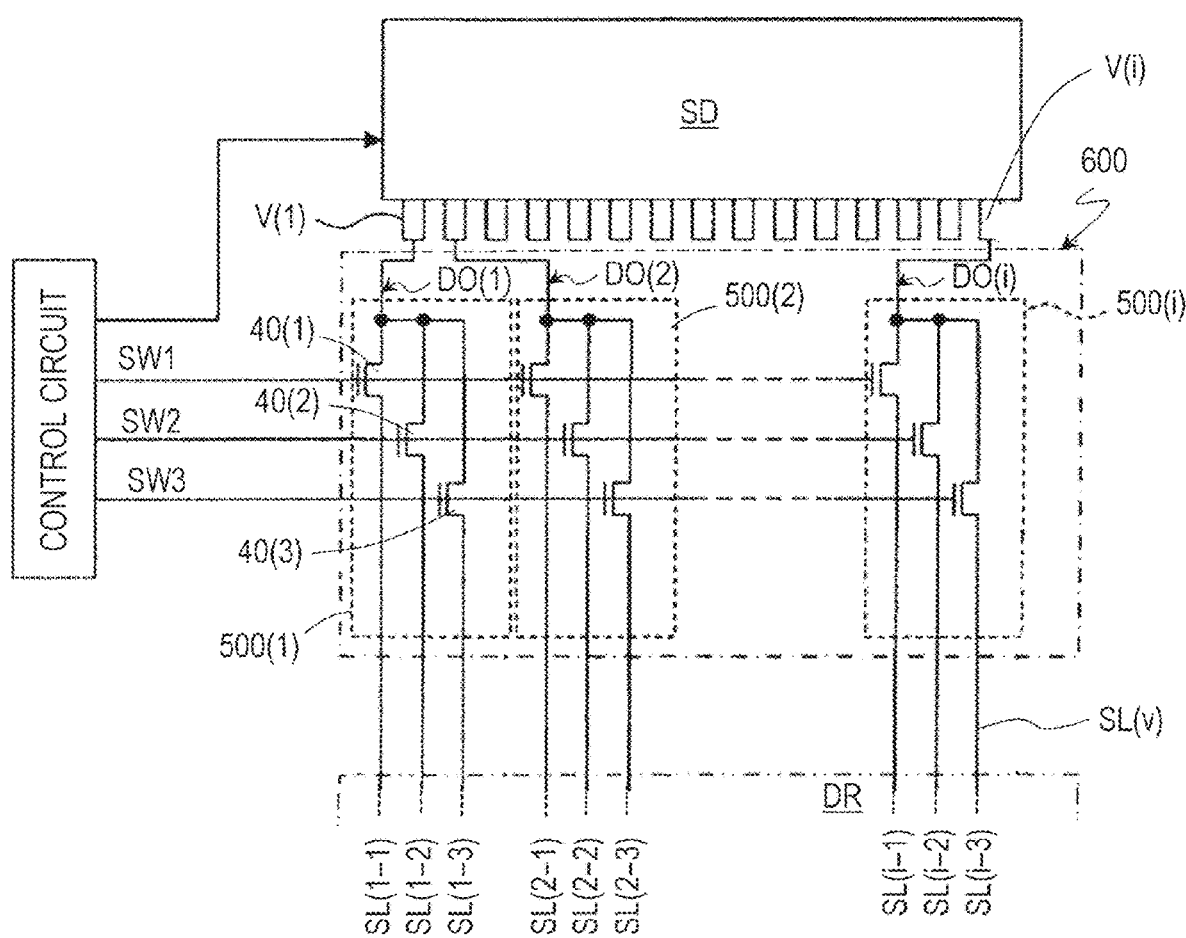
FIG. 10 is a diagram illustrating an SSD circuit.

FIG. 10 is a diagram for explaining the configuration and operation of an SSD circuit.

An SSD circuit 600 is disposed between a source driver SD and the display area DR. The SSD circuit 600 includes a plurality of SSD unit circuits 500(1) to **500(*i*) (where i is an integer greater than or equal to 2) (sometimes referred to collectively as "SSD unit circuits 500") and control signal trunk lines SW1 to SWn (where n is an integer greater than or equal to 2; here, n=3). The SSD circuit 600** and the source driver SD are controlled by a control circuit provided in the non-display area FR. The control signal trunk lines SW1 to SWn are connected to the control circuit.

Any of a plurality of video signal lines DO(1) to DO(i) (sometimes referred to collectively as "video signal lines DO") is connected to each of output terminals V(1) to V(i) (hereinafter sometimes referred to collectively as "V terminals") of the source driver SD. A group of n source bus lines SL is associated with one video signal line DO. The SSD unit circuits 500 are provided separately between each of the video signal lines DO and the corresponding group of source bus lines SL. Each of the SSD unit circuits 500 distributes video data from a corresponding one of the video signal lines DO to the corresponding n source bus lines SL.

The present embodiment assumes that DO(N) (where N is an integer of 1 to i) denotes an Nth one of the plurality of video signal lines DO(1) to DO(i), 500(N) denotes an SSD unit circuit 500 associated with the video signal line DO(N), and SL(N−1) to SL(N−n) denote source bus lines SL associated with the video signal line DO(N). The source bus lines SL(N−1) to SL(N−n) may be associated, for example, with R, G, and B pixels (i.e. n=3).

Each of the SSD unit circuits 500(N) includes at least n (here, three) thin-film transistors (SSD circuit TFTs) 40(1) to **40(*n*) (sometimes referred to collectively as "SSD circuit TFTs 40**").

The SSD circuit TFTs 40 function as selecting switches. Each of the SSD circuit TFTs 40 has a gate electrode electrically connected to a corresponding one of the n control signal trunk lines SW1 to SWn. Each of the SSD circuit TFTs 40 has a source electrode electrically connected to a branch wire of the video signal line DO(N). Each of the SSD circuit TFTs 40 has a drain electrode connected to a corresponding one of the source bus lines SL (N−1) to SL(N−3).

The gate electrode of each of the SSD circuit TFTs 40 is supplied with a selection signal (control signal) from one of the control signal trunk lines SW1 to SW3. The control signal defines a period of time during which the selecting switches are on in the same group, and is synchronized with time-series signal outputs from the source driver SD. Each of the SSD unit circuits 500(N) obtains data potentials by time-dividing an output from the video signal line DO(N) and writes the data potentials in the plurality of source bus lines SL(N−1) to SL(N−n) on a time-series basis (time-division driving). This makes it possible to reduce the number of V terminals of the source driver SD, thus making it possible to further reduce the area of the non-display area FR (i.e. to achieve a narrower frame).

In the present embodiment, TFTs having higher mobility than other circuit TFTs or pixel circuits, i.e. having great current drive force, can be used as the SSD circuit TFTs 40. For example, high-mobility second TFTs 200 may be suitably used as the SSD circuit TFTs 40. The second TFTs may have depression characteristics.

The configuration of the SSD circuit is not limited to the illustrated configuration. Configurations, operation, or other features of SSD circuits are disclosed, for example, in Japanese Unexamined Patent Application Publication No. 2008-225036, Japanese Unexamined Patent Application Publication No. 2006-119404, International Publication No. 2011/118079, or other documents. The entire contents of Japanese Unexamined Patent Application Publication No. 2008-225036, Japanese Unexamined Patent Application Publication No. 2006-119404, and International Publication No. 2011/118079 are hereby incorporated by reference.

Oxide Semiconductor

The oxide semiconductor (also referred to as "metal oxide" or "oxide material") contained in the oxide semiconductor layer of each TFT in the present embodiment may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor whose c axis is oriented substantially perpendicular to a bedding plane.

The oxide semiconductor layer may have a laminated structure of two or more layers. In a case where the oxide semiconductor layer has a laminated structure, the oxide semiconductor layer may include an amorphous oxide semiconductor layer and a crystalline oxide semiconductor layer. Alternatively, the oxide semiconductor layer may include a plurality of crystalline oxide semiconductor layers of different crystal structures. Further, the oxide semiconductor layer may include a plurality of amorphous oxide semiconductor layers. In a case where the oxide semiconductor layer has a two-layer structure including an upper layer and a lower layer, the energy gap of an oxide semiconductor contained in one of the two layers located beside the gate electrode (in the case of a bottom-gate structure, the lower layer; in the case of a top-gate structure, the upper layer) may be smaller than the energy gas of an oxide semiconductor contained in a layer located on the opposite side of the gate electrode (in the case of a bottom-gate structure, the upper layer; in the case of a top-gate structure, the lower layer). Note, however, that in a case where the difference between the energy gaps of these layers is comparatively small, the energy gap of the oxide semiconductor of the layer located beside the gate electrode may be greater than the energy gap of the oxide semiconductor of the layer located on the opposite side of the gate electrode.

Materials of amorphous oxide semiconductors and each of the aforementioned crystalline oxide semiconductors, structures thereof semiconductors, methods for forming films thereof, configurations of oxide semiconductor layers having laminated structures, or other features are described, for example, in Japanese Unexamined Patent Application Publication No. 2014-007399. The entire contents of Japanese Unexamined Patent Application Publication No. 2014-007399 are hereby incorporated by reference.

The oxide semiconductor layer may contain at least one type of metallic element of In, Ga, and Zn. In the present embodiment, the oxide semiconductor layer contains, for example, an In—Ga—Zn—O semiconductor (e.g. indium-gallium-zinc oxide). Note here that the In—Ga—Zn—O semiconductor is a ternary oxide of In (indium), Ga (gallium), and Zn (zinc) and examples of the proportions of In, Ga, and Zn (composition ratios) include, but are not limited to In:Ga:Zn=2:2:1, In:Ga:Zn=1:1:1, and In:Ga:Zn=1:1:2. Such an oxide semiconductor layer may be formed from an oxide semiconductor film containing the In—Ga—Zn—O semiconductor.

The In—Ga—Zn—O semiconductor may be amorphous or crystalline. As the crystalline In—Ga—Zn—O semiconductor, a crystalline In—Ga—Zn—O semiconductor whose c axis is oriented substantially perpendicular to a bedding plane is preferable.

Crystal structures of amorphous In—Ga—Zn—O semiconductors are described, for example, in the aforementioned Japanese Unexamined Patent Application Publication No. 2014-007399, Japanese Unexamined Patent Application Publication No. 2012-134475, Japanese Unexamined Patent Application Publication No. 2014-209727, or other documents. The entire contents of Japanese Unexamined Patent Application Publication No. 2012-134475 and Japanese Unexamined Patent Application Publication No. 2014-209727 are hereby incorporated by reference. A TFT having an In—Ga—Zn—O semiconductor layer has high mobility (more than twenty times higher than that of an a-Si TFT) and a low leak current (less than 100/1 of that of an a-Si TFT) and can therefore be suitably used as a drive TFT (i.e. a TFT provided around a display area including a plurality of pixels and on the same substrate as the display area) and a pixel TFT (i.e. an TFT provided in a pixel).

The oxide semiconductor layer may contain another oxide semiconductor instead of the In—Ga—Zn—O semiconductor. For example, the oxide semiconductor layer may contain an In—Sn—Zn—O semiconductor (e.g. $In_2O_3$—$SnO_2$—ZnO; InSnZnO). The In—Sn—Zn—O semiconductor is a ternary oxide of In (indium), Sn (tin), and Zn (zinc). Alternatively, the oxide semiconductor layer may contain an In—Al—Zn—O semiconductor, an In—Al—Sn—Zn—O semiconductor, a Zn—O semiconductor, an In—Zn—O semiconductor, a Zn—Ti—O semiconductor, a Cd—Ge—O semiconductor, a Cd—Pb—O semiconductor, CdO (cadmium oxide), a Mg—Zn—O semiconductor, an In—Ga—Sn—O semiconductor, an In—Ga—O semiconductor, a Zr—In—Zn—O semiconductor, a Hf—In—Zn—O semiconductor, an Al—Ga—Zn—O semiconductor, a Ga—Zn—O semiconductor, an In—Ga—Zn—Sn—O semiconductor, an In—W—Zn—O semiconductor, or other semiconductors.

The present embodiment may be suitably applied to an active matrix substrate having a monolithically formed peripheral circuit. Such an active matrix substrate is applied to various types of electronic device such as a display device such as a liquid crystal display device, an organic electroluminescence (EL) display device, or an inorganic electroluminescence display device, an imaging device such as an image sensor device, an image input device, a fingerprint reading device, and a semiconductor memory.

The present disclosure contains subject matter related to that disclosed in Japanese Priority Patent Application JP 2020-214854 filed in the Japan Patent Office on Dec. 24, 2020, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate comprising:
   a substrate; and
   a plurality of oxide semiconductor TFTs, supported by a principal surface of the substrate, that include a first TFT and a second TFT,
   wherein
   each of the oxide semiconductor TFTs has an oxide semiconductor layer, a gate insulating layer disposed over a part of the oxide semiconductor layer, a gate electrode disposed over a part of the gate insulating layer, a source electrode, and a drain electrode,
   the oxide semiconductor layer of the first TFT is formed from a first oxide semiconductor film,
   the oxide semiconductor layer of the second TFT is a layer that is separate from the oxide semiconductor layer of the first TFT, and is formed from a second oxide semiconductor film that is higher in mobility than the first oxide semiconductor film, each of the oxide semiconductor layers of the first and second TFTs includes
a high-resistance region covered with the gate insulating layer, and
low-resistance regions located on both sides of the high-resistance region and not covered with the gate insulating layer, the low-resistance regions having smaller specific resistance than the high-resistance region,
the high-resistance region includes a channel region overlapping the gate electrode when viewed from an angle parallel with a direction normal to the principal surface of the substrate and offset regions that, when viewed from an angle parallel with the direction normal to the principal surface of the substrate, overlap the gate insulating layer but do not overlap the gate electrode, the offset regions including source-side and drain-side offset regions located on both sides, respectively, of the channel region,
the low-resistance regions include a source contact region electrically connected to the source electrode, a drain contact region placed opposite the source contact region across the high-resistance region and electrically connected to the drain electrode, a source-side interposed region located between the source contact region and the high-resistance region, and a drain-side interposed region located between the drain contact region and the high-resistance region,
the gate insulating layer of the first TFT includes a first insulating film and a second insulating film disposed over the first insulating film,
the gate insulating layer of the second TFT includes the second insulating film but does not include the first insulating film, and
a total length L1 of the offset regions of the first TFT in a channel length direction is greater than a total length L2 of the offset regions of the second TFT in the channel length direction.

2. The active matrix substrate according to claim 1, further comprising a first insulating layer located between the oxide semiconductor layer of the second TFT and the substrate,
wherein the first insulating layer includes the first insulating film.

3. A method for manufacturing the active matrix substrate according to claim 2, the method comprising:
(A) forming the oxide semiconductor layer of the first TFT over the substrate;
(B) forming an insulating film so that the insulating film covers the oxide semiconductor layer of the first TFT, the insulating film being to serve as the first insulating film;
(C) forming the oxide semiconductor layer of the second TFT over the insulating film;
(D) forming a different insulating film so that the different insulating film covers the oxide semiconductor layer of the second TFT, the different insulating film being to serve as the second insulating film;
(E) forming the gate electrode of the first TFT and the gate electrode of the second TFT over the different insulating film;
(F) by patterning the insulating film and the different insulating film after step (E), obtaining the first insulating film and the second insulating film from the insulating film and the different insulating film, respectively, thereby forming the gate insulating layer of the first TFT and the gate insulating layer of the second TFT and forming the first insulating layer on a side of the oxide semiconductor layer of the second TFT that faces the substrate; and
(G) by subjecting each of the first and second TFTs to a resistance lowering process for making portions of the oxide semiconductor layer not covered with the gate insulating layer lower in specific resistance than a portion of the oxide semiconductor layer covered with the gate insulating layer, forming the low-resistance regions in the portions of the oxide semiconductor layer not covered with the gate insulating layer.

4. The method according to claim 3, wherein step (F) includes
forming the gate insulating layer of the first TFT, the gate insulating layer of the second TFT, and the first insulating layer by subjecting the insulating film and the different insulating film to dry etching with an identical resist layer as a mask, and
making a width of the gate insulating layer of the first TFT in the channel length direction greater than a width of the gate insulating layer of the second TFT in the channel length direction by performing the dry etching under such conditions that the taper shapes are formed on the side surfaces of the first insulating film and the second insulating film in the gate insulating layer of the first TFT and the side surfaces of the second insulating film in the gate insulating layer of the second TFT.

5. The method according to claim 3, wherein step (F) includes
(f1) subjecting the different insulating film to first etching with a first resist layer as a mask, and
(f2) after step (f1), subjecting the insulating film to second etching with a second resist layer as a mask, the second resist layer being different from the first resist layer.

6. The method according to claim 3, wherein step (F) includes
(f3) patterning the insulating film and the different insulating film by third etching with a third resist layer as a mask to form the gate insulating layer of the second TFT and the first insulating layer in a region in which the second TFT is formed, and
(f4) before or after step (f3), patterning the insulating film and the different insulating film by fourth etching with a fourth resist layer as a mask to form the gate insulating layer of the first TFT in a region in which the first TFT is formed, the fourth resist layer being different from the third resist layer.

7. The active matrix substrate according to claim 1, wherein side surfaces of the first insulating film and the second insulating film in the gate insulating layer of the first TFT and side surfaces of the second insulating film in the gate insulating layer of the second TFT all have taper shapes.

8. The active matrix substrate according to claim 7, wherein the side surfaces of the first insulating film and the side surfaces of the second insulating film in the gate insulating layer of the first TFT are aligned with each other.

9. The active matrix substrate according to claim 7, wherein when viewed from an angle parallel with the direction normal to the substrate, a distance d1 between an edge of the second insulating film and an edge of the gate electrode in the first TFT and a distance d2 between an edge of the second insulating film and an edge of the gate electrode in the second TFT are substantially equal to each other, and a distance d3 between an edge of the first insulating film and the edge of the gate electrode in the first TFT is greater than the distance d1 and the distance d2.

10. The active matrix substrate according to claim 1, wherein
in the gate insulating layer of the first TFT, the second insulating film covers only a part of an upper surface of the first insulating film, and
when viewed from an angle parallel with the direction normal to the substrate, the side surfaces of the second insulating film are located further inward than the side surfaces of the first insulating film.

11. The active matrix substrate according to claim 1, wherein the first insulating film and the second insulating film contain an identical insulating material.

12. The active matrix substrate according to claim 1, wherein the first TFT has a threshold voltage obtained by shifting a threshold voltage of the second TFT in a positive direction.

13. The active matrix substrate according to claim 12, wherein
the first TFT has an enhancement characteristic, and
the second TFT has a depression characteristic.

14. The active matrix substrate according to claim 1, wherein
the active matrix substrate has a display area including a plurality of pixel areas and a non-display area provided around the display area,
the plurality of oxide semiconductor TFTs include a plurality of pixel TFTs each disposed in one of the plurality of pixel areas and a plurality of circuit TFTs constituting a peripheral circuit disposed in the non-display area,
each of the pixel TFTs is the first TFT, and
the plurality of circuit TFTs include the second TFT.

15. The active matrix substrate according to claim 14, further comprising:
a plurality of source bus lines; and
a plurality of gate bus lines,
wherein
the source electrode of each of the pixel TFTs is electrically connected to one of the plurality of source bus lines,
the gate electrode of each of the pixel TFTs is electrically connected to one of the plurality of gate bus lines,
the peripheral circuit includes an SSD circuit that distributes a display signal to n source bus lines of the plurality of source bus lines, and
the SSD circuit includes a plurality of SSD circuit TFTs, and
each of the SSD circuit TFTs is the second TFT.

16. The active matrix substrate according to claim 1, wherein
the active matrix substrate has a display area including a plurality of pixel areas; and a non-display area provided around the display area,
the plurality of oxide semiconductor TFTs include a plurality of pixel TFTs each disposed in one of the plurality of pixel areas and a plurality of circuit TFTs constituting a peripheral circuit disposed in the non-display area, and
the plurality of circuit TFTs include the first TFT and the second TFT.

17. The active matrix substrate according to claim 1, wherein
the first oxide semiconductor film and the second oxide semiconductor film both contain In or Sn or both, and
a total of atomic-number ratios of In and Sn with respect to all metallic elements in the second oxide semiconductor film is greater than a total of atomic-number ratios of In and Sn with respect to all metallic elements in the first oxide semiconductor film.

18. The active matrix substrate according to claim 17, wherein
the first oxide semiconductor film and the second oxide semiconductor film are both In—Ga—Zn—O semiconductor films, and
a total of atomic-number ratios of In with respect to all metallic elements in the second oxide semiconductor film is greater than a total of atomic-number ratios of In with respect to all metallic elements in the first oxide semiconductor film.

19. The active matrix substrate according to claim 1, wherein
the second oxide semiconductor film contains Sn, and
the first oxide semiconductor film either does not contain Sn or contains Sn at a lower concentration than the second oxide semiconductor film.

20. The active matrix substrate according to claim 1, wherein at least either the first oxide semiconductor film or the second oxide semiconductor film is an In—Ga—Zn—O semiconductor film containing a crystalline portion.

* * * * *